(12) United States Patent
Liu et al.

(10) Patent No.: US 12,200,928 B2
(45) Date of Patent: Jan. 14, 2025

(54) MEMORY DEVICE HAVING MEMORY CELL STRINGS AND SEPARATE READ AND WRITE CONTROL GATES

(71) Applicant: Micron Technology, Inc., Boise, ID (US)

(72) Inventors: Haitao Liu, Boise, ID (US); Kamal M. Karda, Boise, ID (US); Albert Fayrushin, Boise, ID (US); Yingda Dong, Los Altos, CA (US)

(73) Assignee: Micron Technology, Inc., Boise, ID (US)

( * ) Notice: Subject to any disclaimer, the term of this patent is extended or adjusted under 35 U.S.C. 154(b) by 249 days.

(21) Appl. No.: 17/387,669

(22) Filed: Jul. 28, 2021

(65) Prior Publication Data

US 2023/0031362 A1 Feb. 2, 2023

(51) Int. Cl.
*H10B 43/27* (2023.01)
*H01L 21/28* (2006.01)
(Continued)

(52) U.S. Cl.
CPC ........ *H10B 43/27* (2023.02); *H01L 29/40114* (2019.08); *H01L 29/40117* (2019.08);
(Continued)

(58) Field of Classification Search
CPC ........ H10B 43/27; H10B 41/27; H10B 43/20; H01L 29/40114; H01L 29/40117; H01L 29/42328; H01L 29/42344
See application file for complete search history.

(56) References Cited

U.S. PATENT DOCUMENTS

| | | | |
|---|---|---|---|
| 2005/0146940 A1* | 7/2005 | Hofmann | H01L 27/1203 365/185.26 |
| 2005/0146959 A1* | 7/2005 | Shiga | G11C 16/26 714/E11.038 |

(Continued)

FOREIGN PATENT DOCUMENTS

| | | |
|---|---|---|
| CN | 117716803 | 3/2024 |
| TW | 201236112 | 9/2012 |
| WO | 2023009941 | 2/2023 |

OTHER PUBLICATIONS

"International Application Serial No. PCT US2022 073775, International Search Report mailed Nov. 11, 2022", 3 pages.

(Continued)

*Primary Examiner* — Shahed Ahmed
*Assistant Examiner* — Khatib A Rahman
(74) *Attorney, Agent, or Firm* — Schwegman Lundberg & Woessner, P.A.

(57) ABSTRACT

Some embodiments include apparatuses and methods of forming the apparatuses. One of the apparatuses includes a memory cell included in a memory cell string; the memory cell including charge storage structure and channel structure separated from the charge storage structure by a dielectric structure; a first control gate associated with the memory cell and located on a first side of the charge storage structure and a first side of the channel structure; and a second control gate associated with the memory cell and electrically separated from the first control gate, the second control gate located on a second side of the charge storage structure and a second side of the channel structure.

16 Claims, 26 Drawing Sheets

(51) Int. Cl.
 *H01L 29/423* (2006.01)
 *H10B 41/27* (2023.01)
(52) U.S. Cl.
 CPC .. *H01L 29/42328* (2013.01); *H01L 29/42344* (2013.01); *H10B 41/27* (2023.02)

(56) References Cited

U.S. PATENT DOCUMENTS

| | | | |
|---|---|---|---|
| 2010/0006919 | A1 | 1/2010 | Kim et al. |
| 2010/0067301 | A1* | 3/2010 | Kim ................. G11C 16/10 257/326 |
| 2012/0241846 | A1* | 9/2012 | Kawasaki ........... H01L 29/7926 257/326 |
| 2015/0357413 | A1* | 12/2015 | Zhang ................. H10B 43/27 257/324 |
| 2016/0093630 | A1 | 3/2016 | Tan et al. |
| 2017/0278858 | A1 | 9/2017 | Walker et al. |
| 2020/0411115 | A1* | 12/2020 | Sakakibara ......... G11C 11/5628 |

OTHER PUBLICATIONS

"International Application Serial No. PCT US2022 073775, Written Opinion mailed Nov. 11, 2022", 6 pages.
"Taiwanese Application Serial No. 111127300, Office Action mailed Sep. 21, 2023", with English translation, 27 pages.
"International Application Serial No. PCT US2022 073775, International Preliminary Report on Patentability mailed Feb. 8, 2024", 8 pgs.

\* cited by examiner

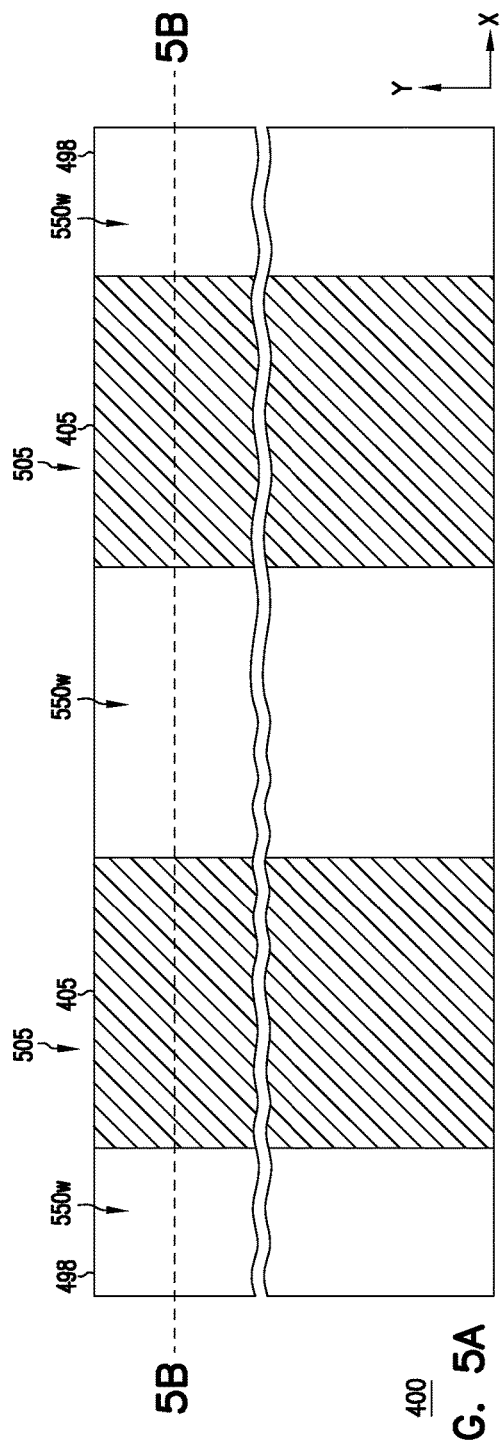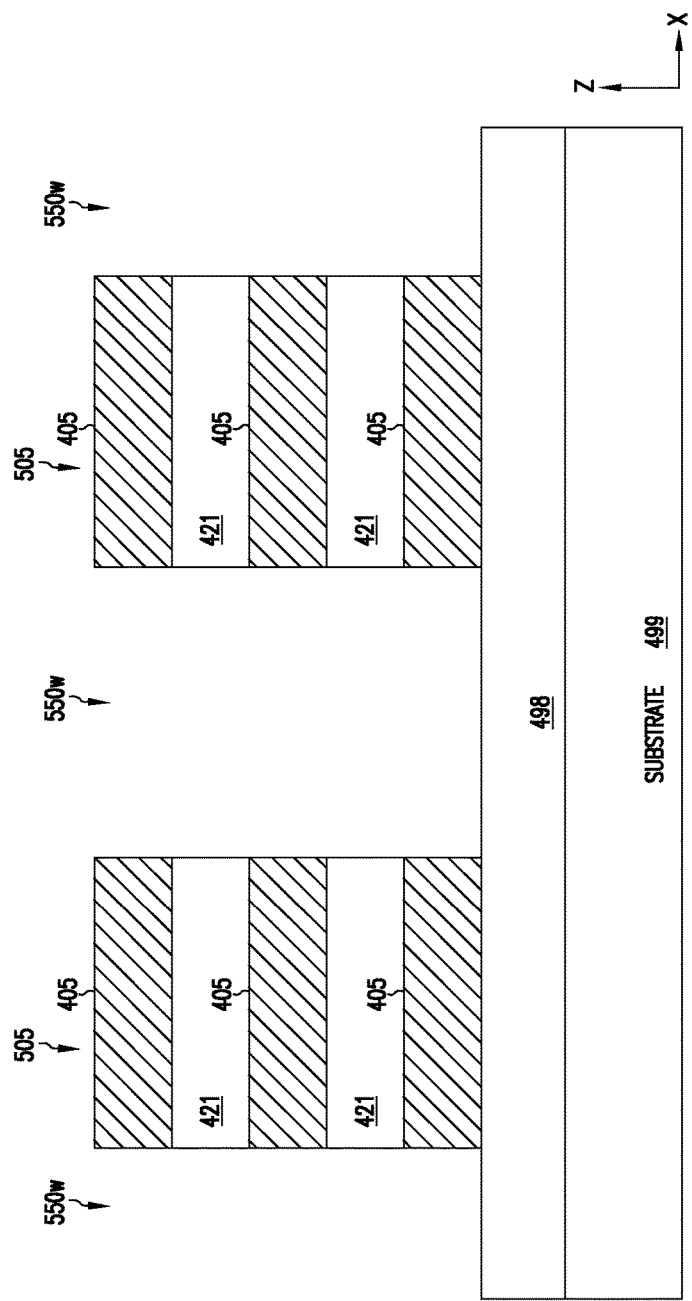

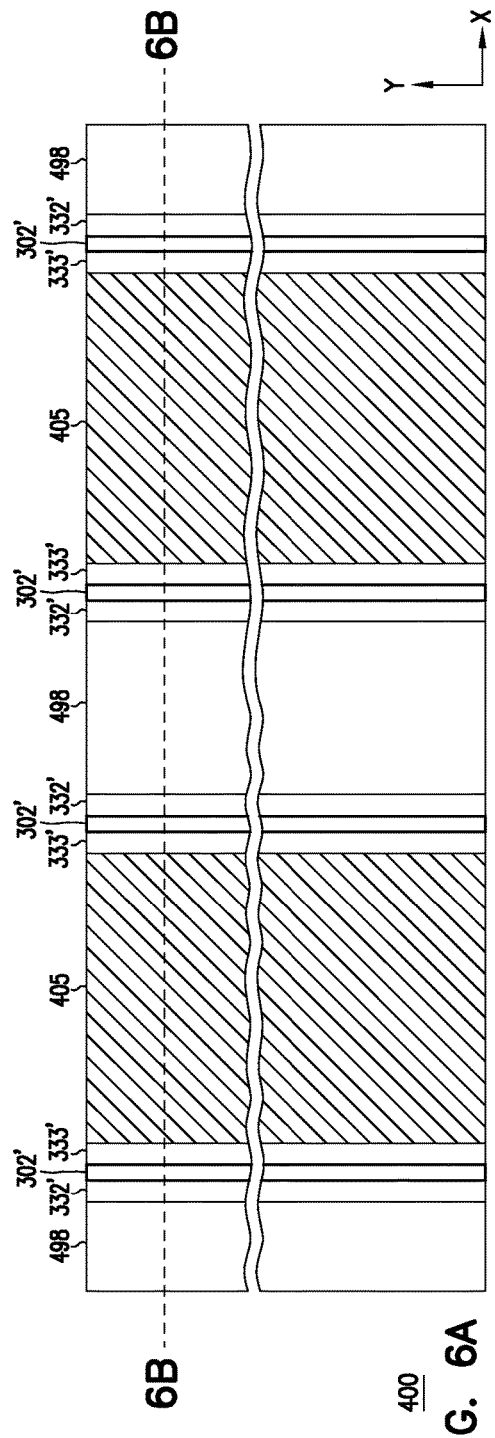
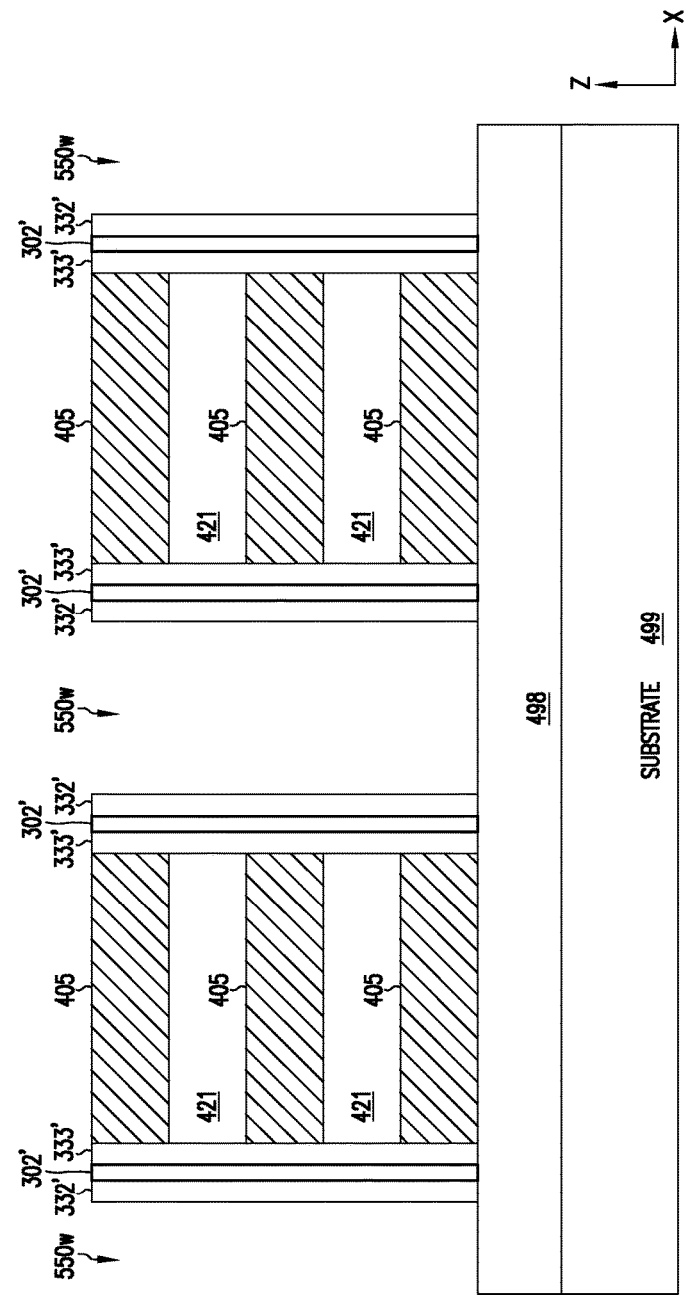
FIG. 6A
FIG. 6B

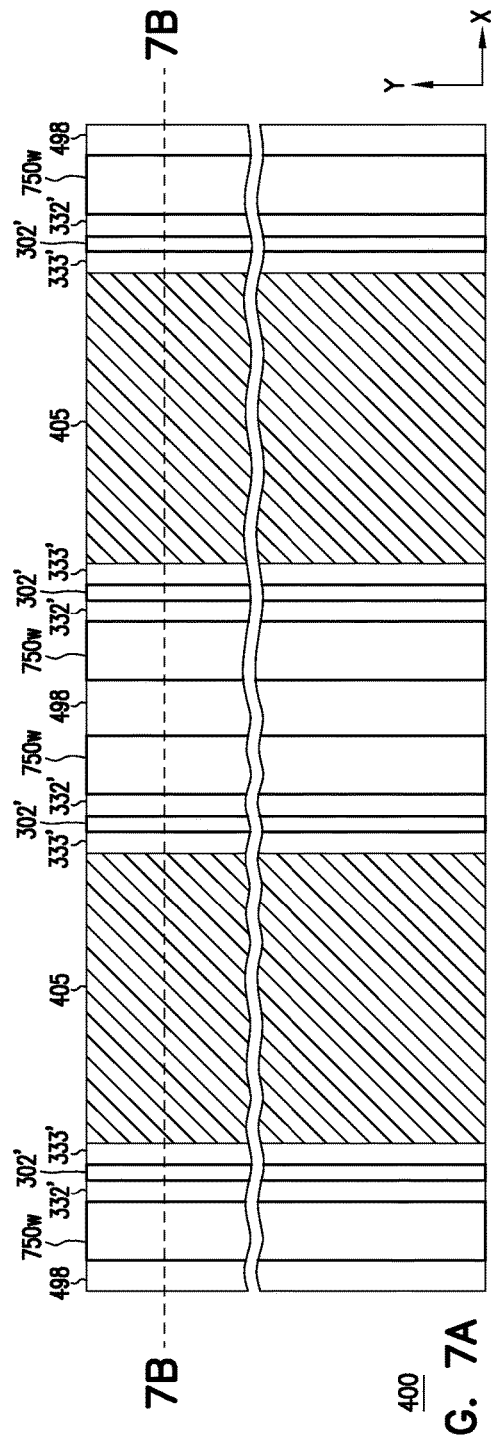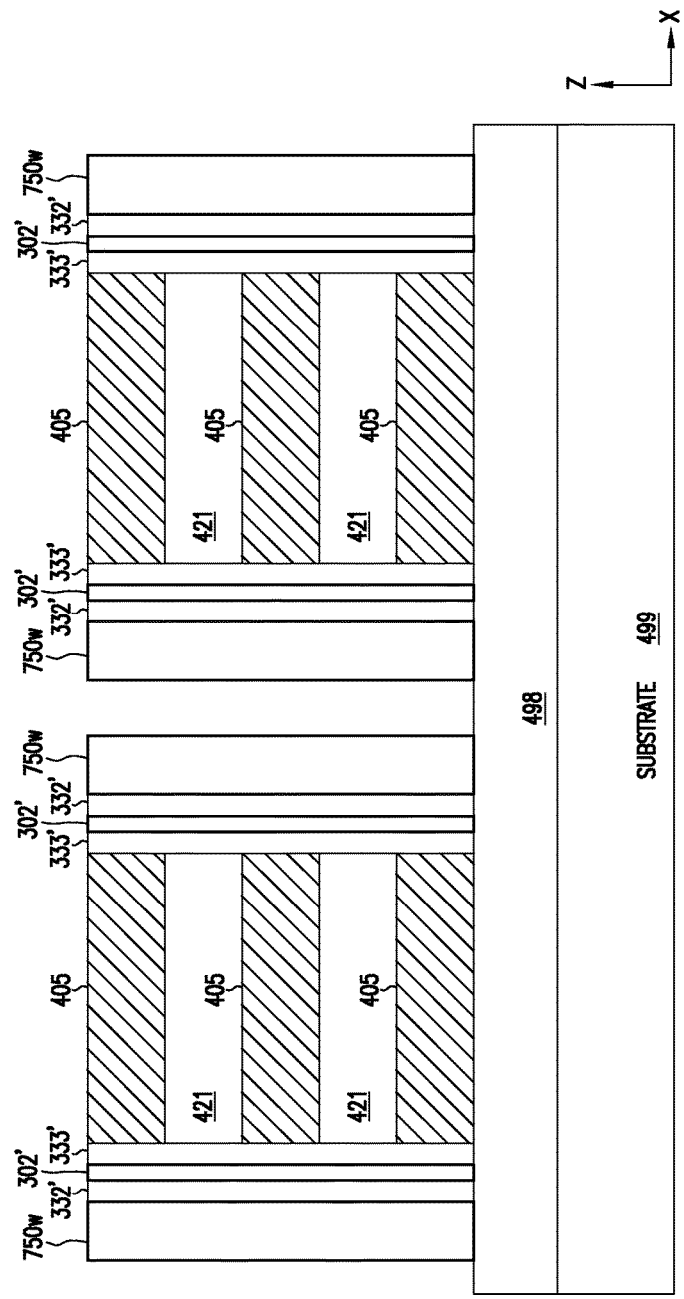
FIG. 7A
FIG. 7B

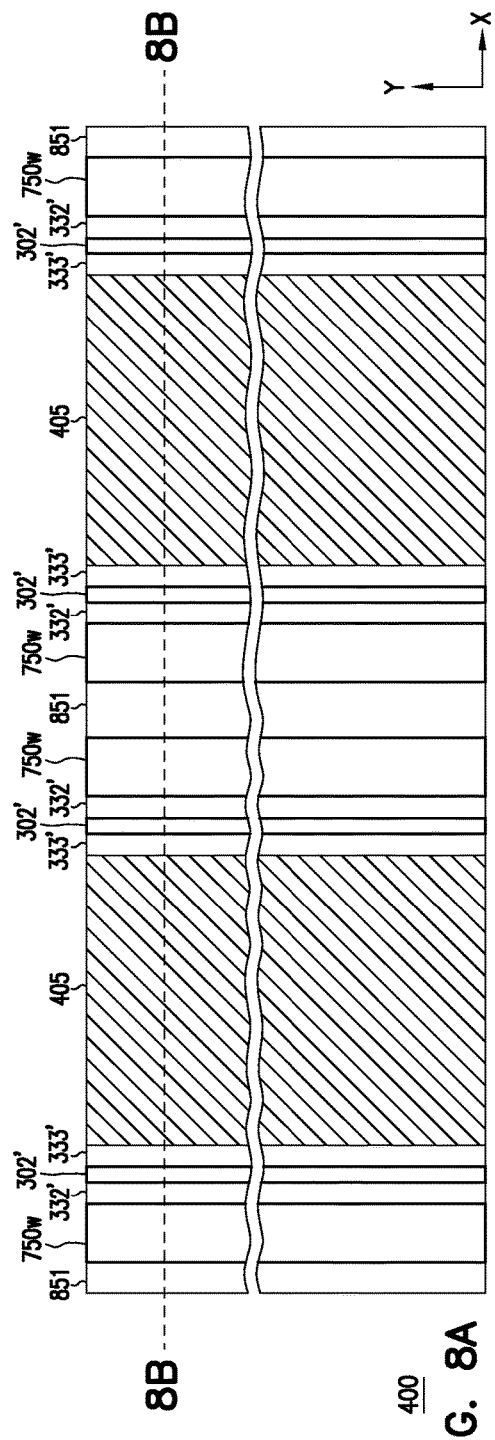
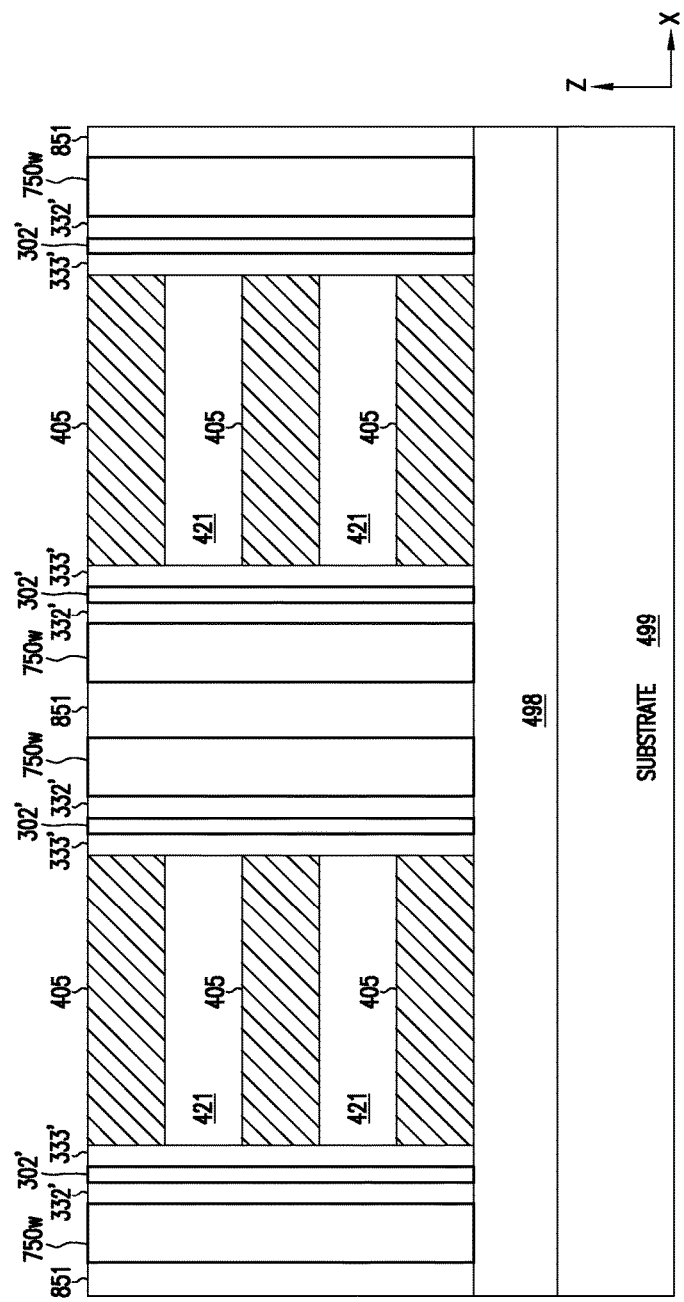
FIG. 8A
FIG. 8B

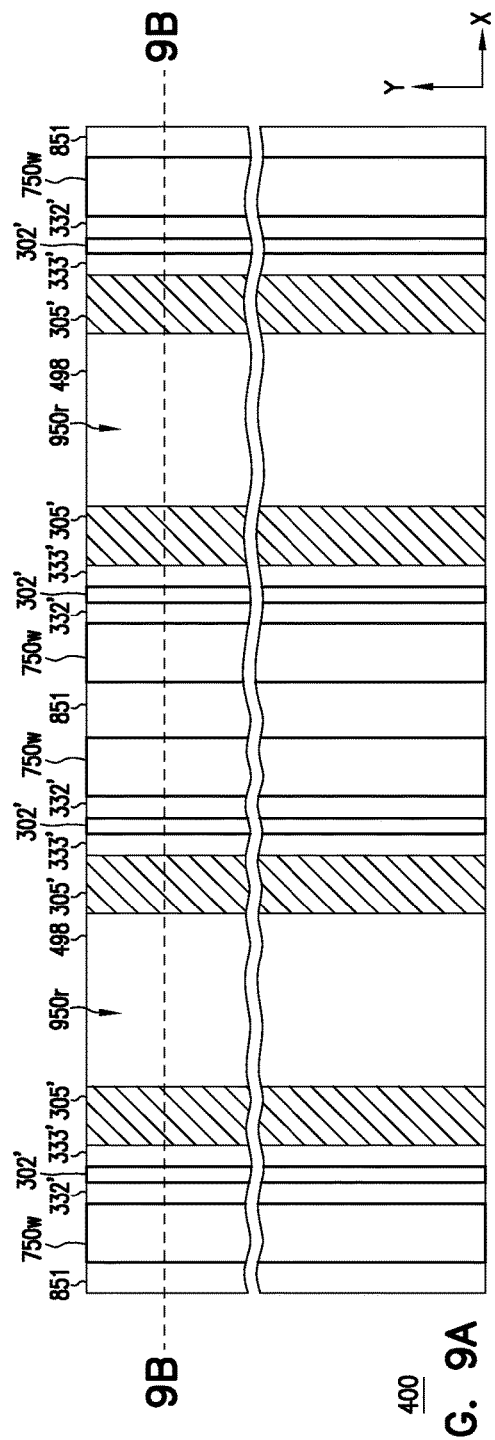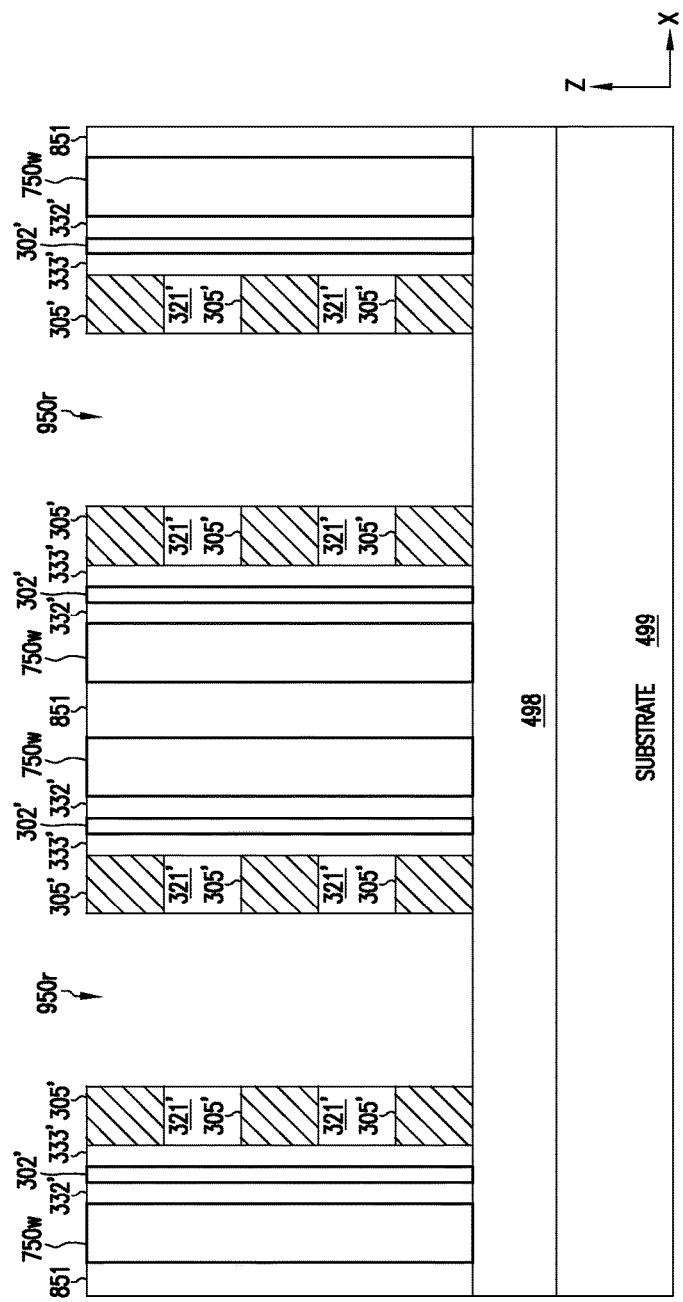

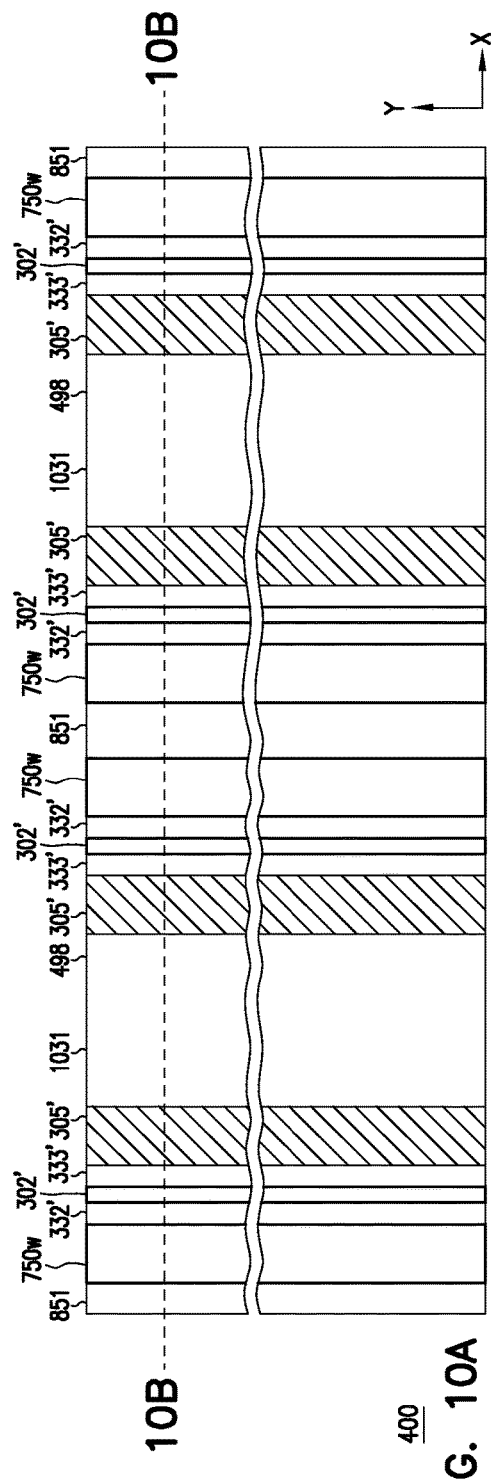
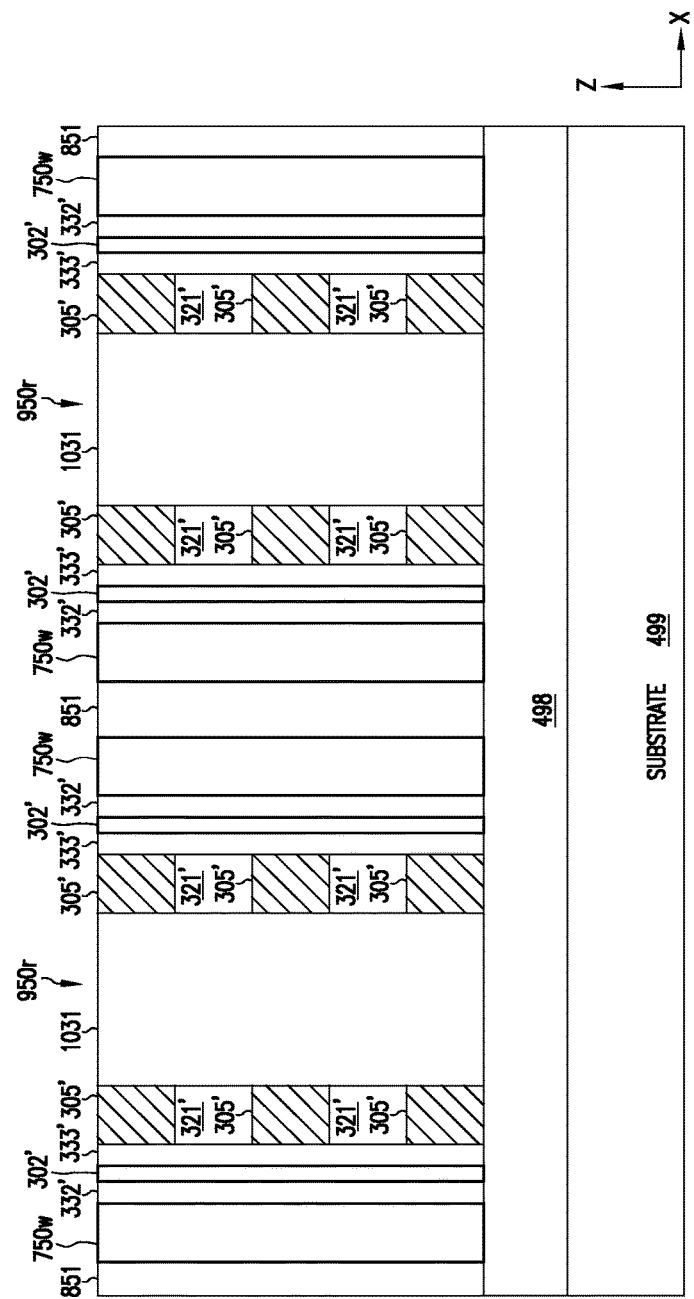
FIG. 10A
FIG. 10B

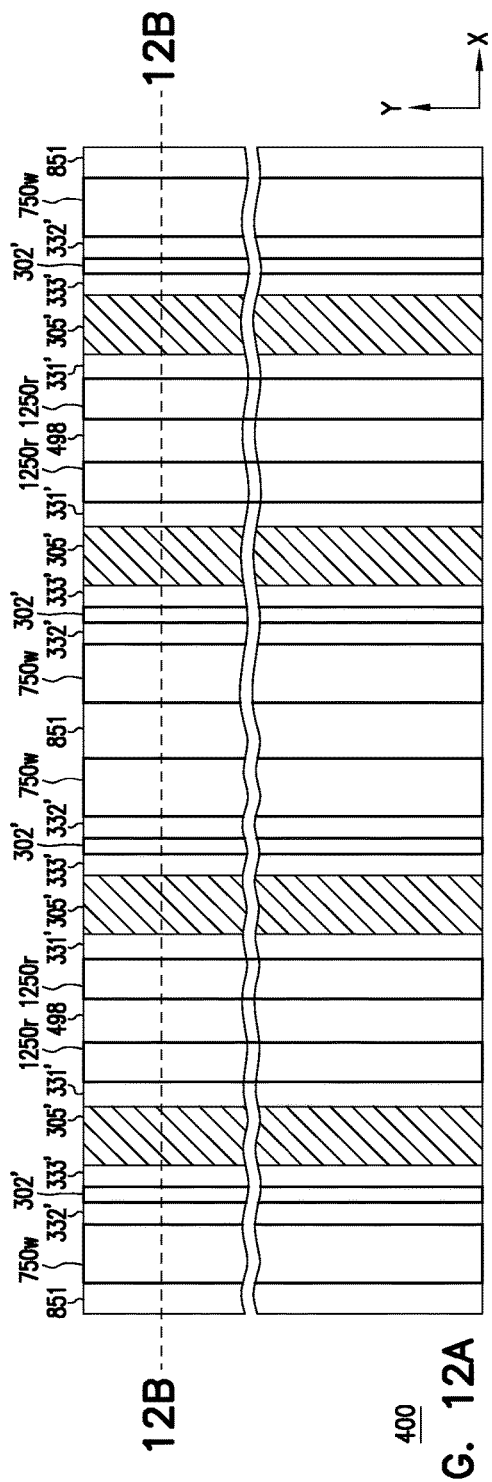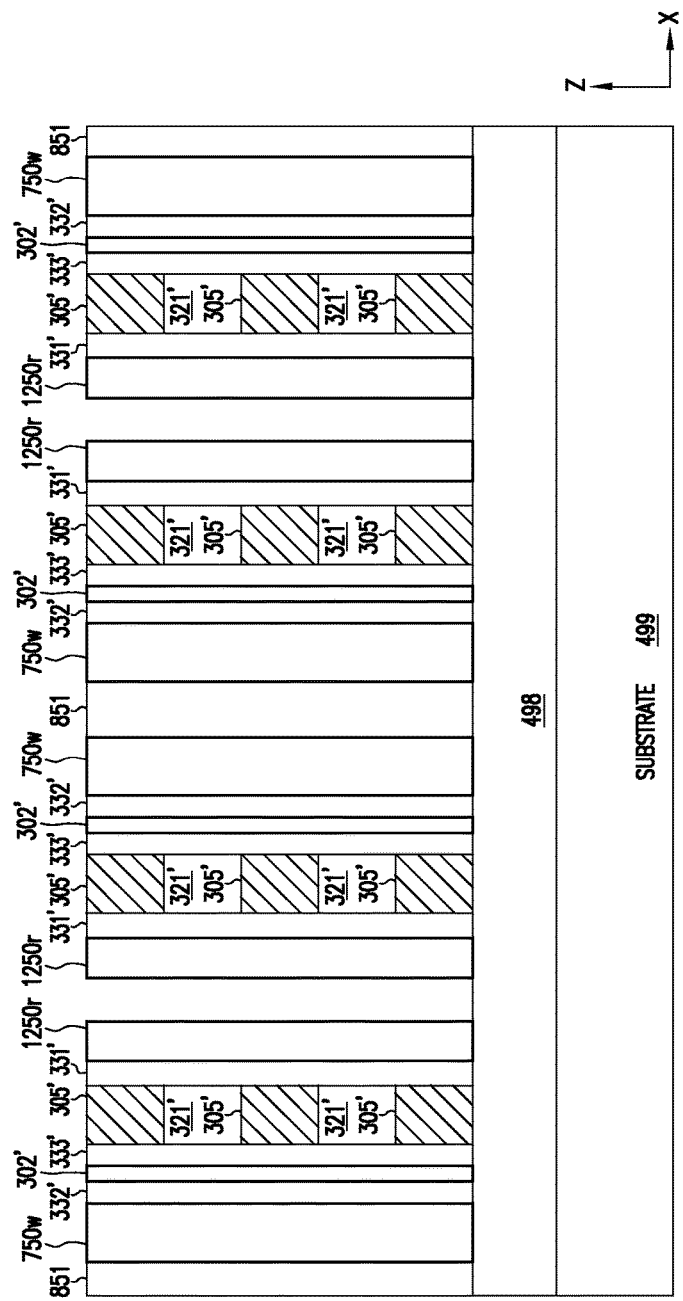
FIG. 12A
FIG. 12B

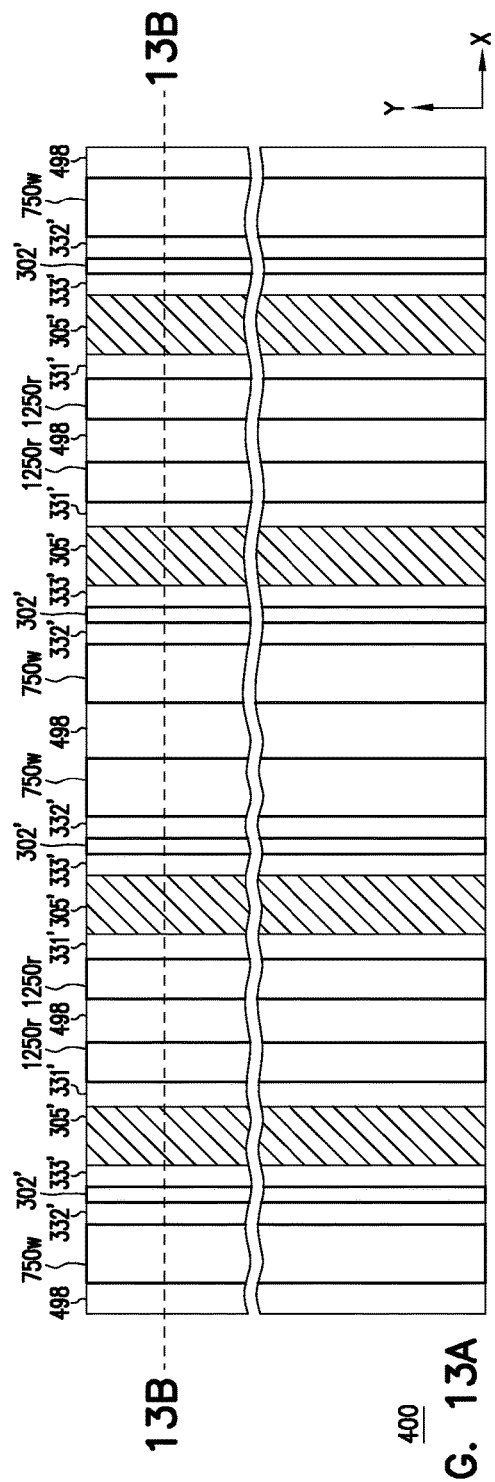
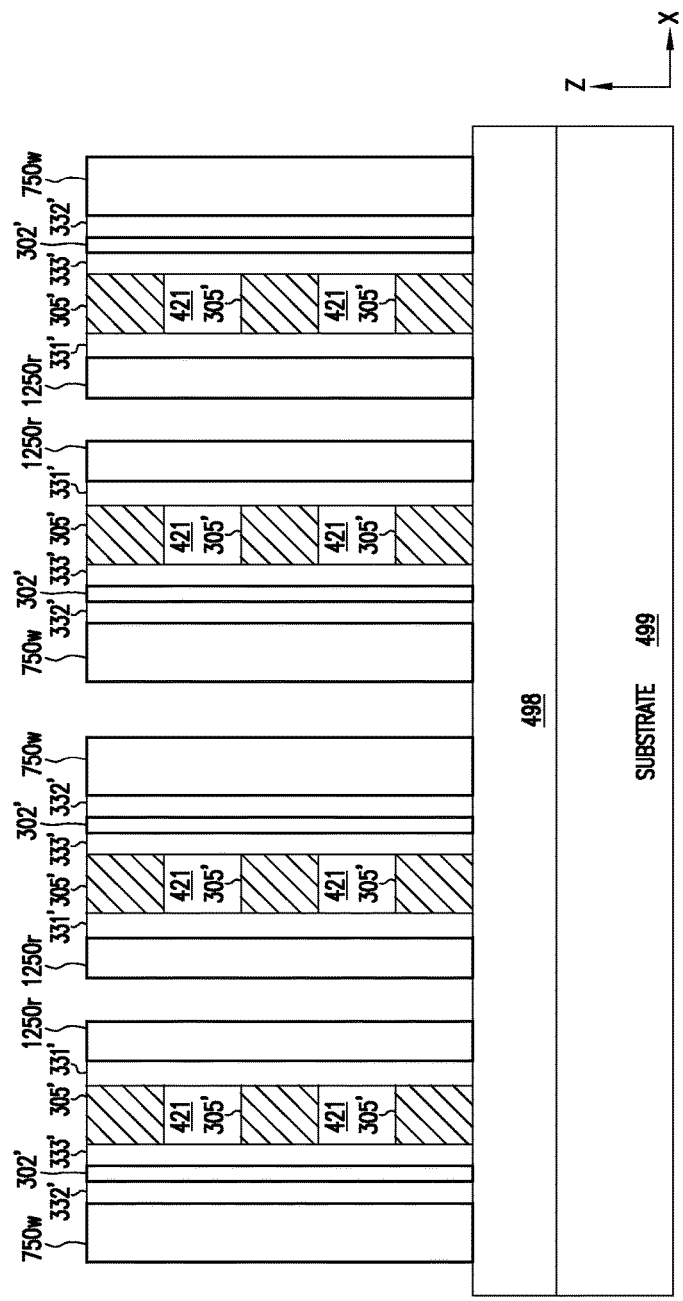
FIG. 13A
FIG. 13B

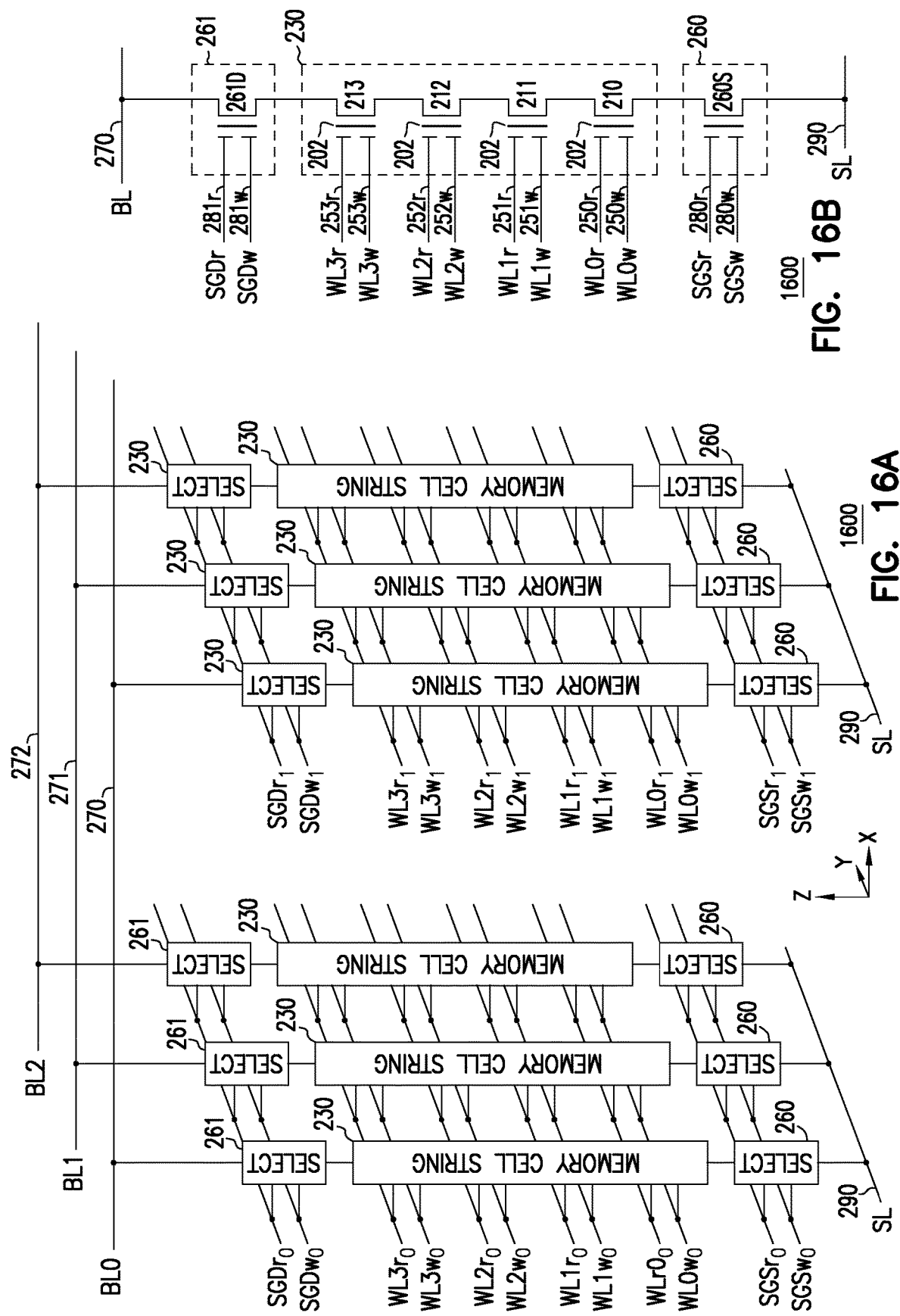

US 12,200,928 B2

MEMORY DEVICE HAVING MEMORY CELL STRINGS AND SEPARATE READ AND WRITE CONTROL GATES

TECHNICAL FIELD

Embodiments described herein relate to memory devices including memory cell strings and control gates associated with the memory cell strings.

BACKGROUND

Memory devices, such as flash memory devices, are widely used in computers and many other electronic items. A memory device usually has numerous memory cells that have charge storage structures for storing information (e.g., data) and data lines for carrying information (in the form of electrical signals) to and from the memory cells. The memory device also has control gates for accessing the memory cells during a write operation to store information in the memory cells or during a read operation to read information (e.g., previously stored information) from the memory device. Some conventional memory devices have the same control gates that are used for both read and write operations performed on the memory cells. Such conventional memory devices may be susceptible to an undesirable condition such as read disturbance during read operations. Further, degradation can potentially happen to gate oxide structures between the control gates and charge storage structures of the memory cells. Read disturbance and structural degradation in a memory device can lead to inferior device performance, unreliable memory operations, or both.

BRIEF DESCRIPTION OF THE DRAWINGS

FIG. 4A and FIG. 4B through FIG. 14D show different views of elements during processes of forming a memory device, according to some embodiments described herein.

FIG. 16A, FIG. 16B, and FIG. 16C show a schematic diagram and structure of a memory device, according to some embodiments described herein.

DETAILED DESCRIPTION

The techniques described herein provide a memory device having separate read and write control gates associated with memory cells of the memory device. The structure of the memory device described herein can reduce or prevent read disturbance that may occur in some conventional memory devices. Further, the structure of the described memory device can provide a relatively larger program-erase window, and increased current in memory cell strings during read operations. The described device structure leads to improvement in memory operations. Moreover, the footprint of the device structure described herein can be relatively small. This can allow for a better device scaling. Improvements and benefits of the techniques described herein are further discussed below with reference to FIG. 1 through FIG. 17.

Figure 1:
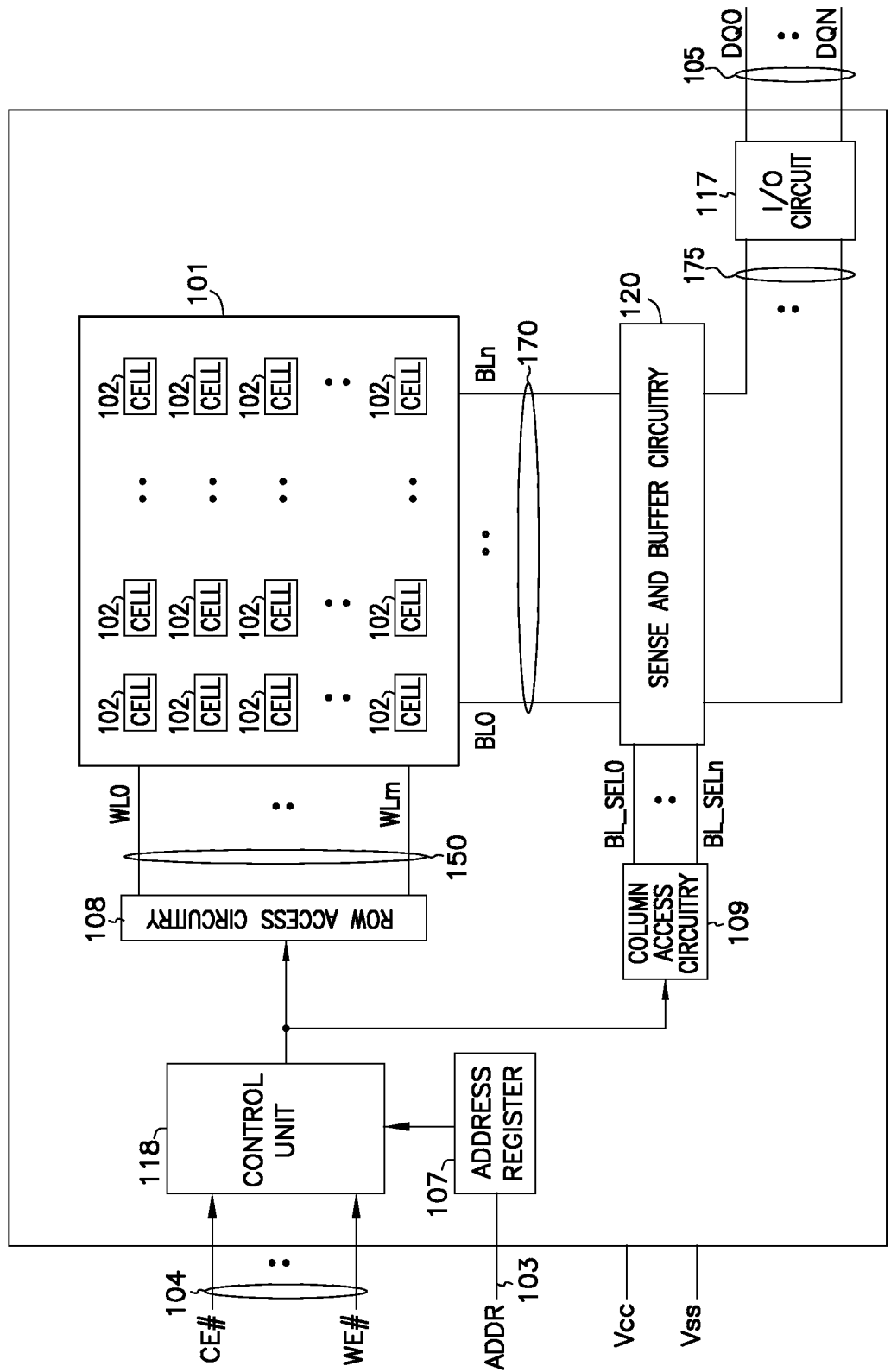
FIG. 1 block diagram of an apparatus in the form of a memory device, according to some embodiments described herein.

FIG. 1 shows a block diagram of an apparatus in the form of a memory device, according to some embodiments described herein. Memory device 100 can include a memory array (or multiple memory arrays) 101 containing memory cells 102. Memory cells 102 can be arranged in memory cell strings where each memory cell string can include multiple memory cells connected in series with each other.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 and data lines 170 to selectively exchange information (e.g., data) with memory cells 102.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 are to be accessed during a memory operation. Memory device 100 can perform a read operation to read (e.g., sense) information (e.g., previously stored information) from memory cells 102, or a write (e.g., programming) operation to store (e.g., program) information in memory cells 102. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102.

Memory device 100 can include a control unit 118 that can be configured to control memory operations of memory device 100 based on control signals on lines 104. Examples of the control signals on lines 104 include one or more clock signals and other signals (e.g., a chip enable signal CE #, a write enable signal WE #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that causes memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) and provide the value of the information to lines (e.g., global data lines) 175. Sense and buffer circuitry 120 can also be configured to use signals on lines 175 to determine the value of information to be stored (e.g., programmed) in memory cells 102 (e.g., during a write operation) based on the values (e.g., voltage values) of signals on lines 175 (e.g., during a write operation).

Memory device 100 can include input/output (I/O) circuitry 117 to exchange information between memory cells 102 and lines (e.g., I/O lines) 105. Signals DQ0 through DQN on lines 105 can represent information read from or stored in memory cells 102. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits (e.g., more than three bits in each memory cell). A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3D NAND) or a NOR flash memory device, or another kind of memory device, such as a variable resistance memory device (e.g., a phase change memory device or a resistive Random Access Memory (RAM) device).

One of ordinary skill in the art may recognize that memory device 100 may include other components, several of which are not shown in FIG. 1 so as not to obscure the example embodiments described herein. At least a portion of memory device 100 can include structures and perform operations similar to or the same as the structures and operations of any of the memory devices described below with reference to FIG. 2 through FIG. 17.

Figure 2A:
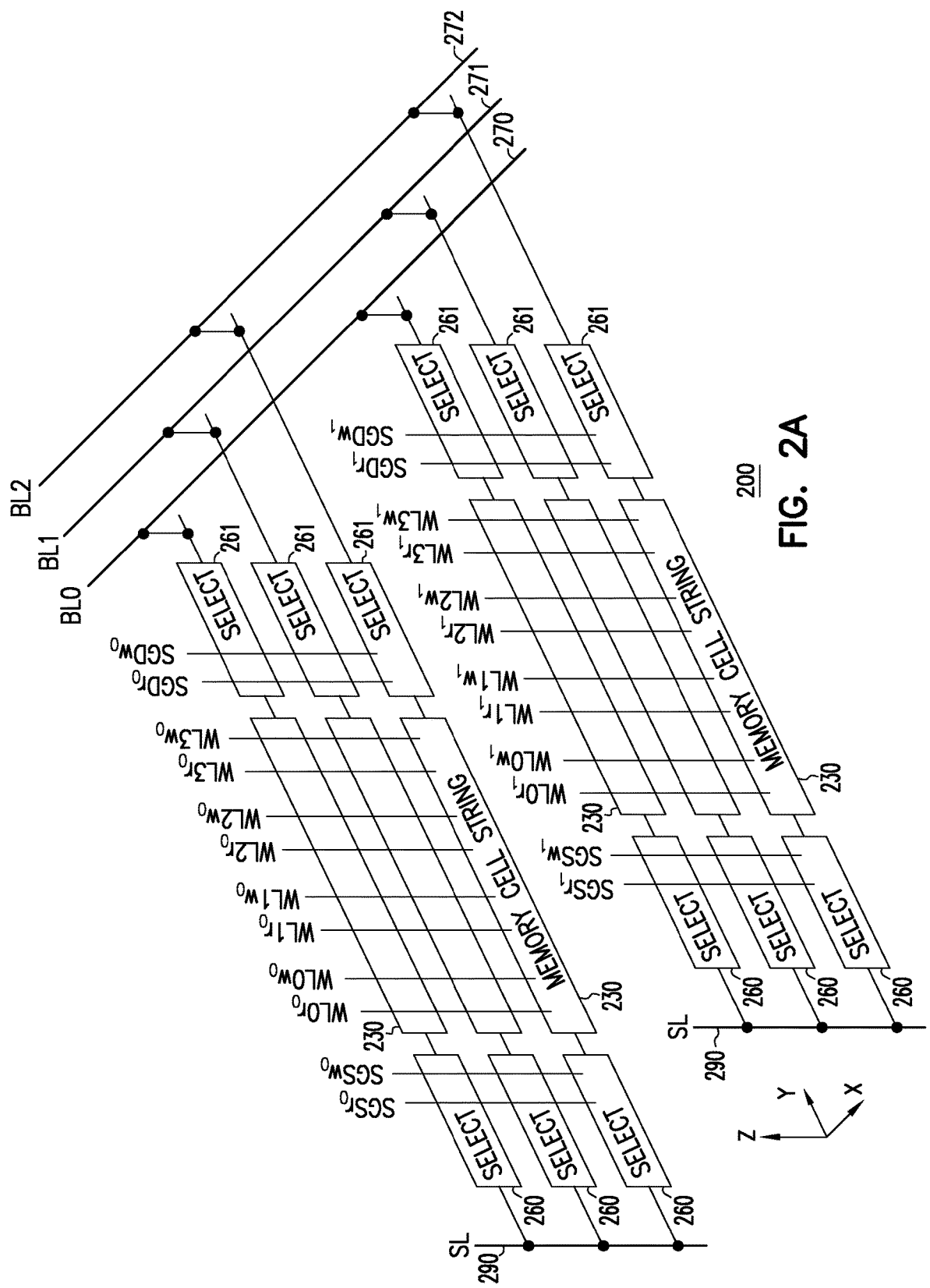
FIG. 2A and FIG. 2B show schematic diagrams of a portion of a memory device including memory cell strings and read and write control gates for accessing a respective memory cell of the memory cell strings, according to some embodiments described herein.
Figure 2B:
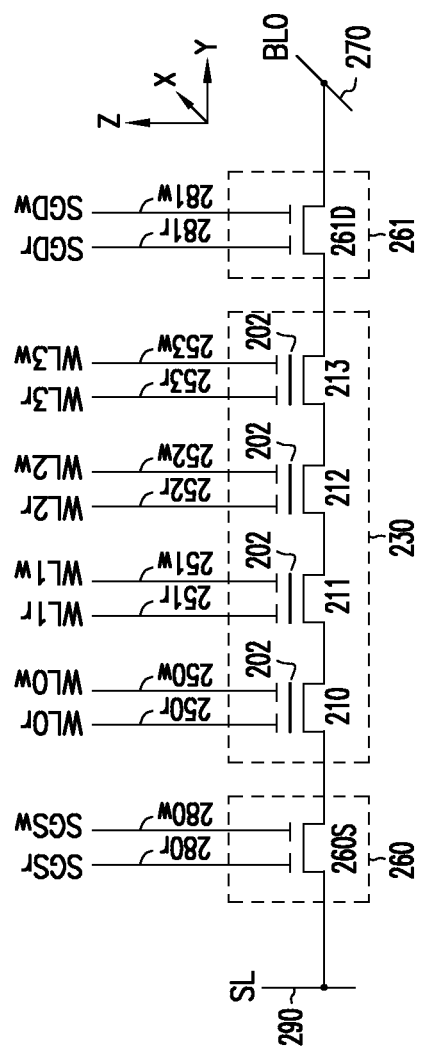

FIG. 2A and FIG. 2B show schematic diagrams of a portion of a memory device 200 including memory cell strings 230 and control gates for accessing a respective memory cell of memory cell strings 230, according to some embodiments described herein. Memory device 200 can correspond to memory device 100 of FIG. 1. For example, memory cell strings 230 can form part of memory array 101 of FIG. 1.

In FIG. 2A, directions X, Y, and Z can represent relative physical directions (e.g., dimensions) of the structure of memory device 200. For example, the Z-direction can be a direction perpendicular to (e.g., vertical direction with respect to) a plane (e.g., X-Y plan) of substrate (e.g., a substrate 399 shown in FIG. 3A) of memory device 200. The Z-direction is perpendicular to the X-direction and Y-direction (e.g., the Z-direction is perpendicular to an X-Y plane of memory device 200).

As shown in FIG. 2A, memory device 200 can include select circuits (labeled "SELECT") 260 and 261, data lines 270, 271, and 272, sources 290, and control gates associated with memory cell strings 230. The control gates can be divided into different groups of control gates, for example, control gates associated with signals (e.g., word line signals) $WL0r_0$, $WL0w_0$, $WL1r_0$, $WL1w_0$, $WL2r_0$, $WL2w_0$, $WL3r_0$, and $WL3w_0$; and control gates associated with signals (e.g., word line signals) $WL0r_1$, $WL0w_1$, $WL1r_1$, $WL1w_1$, $WL2r_1$, $WL2w_1$, $WL3r_1$, and $WL3w_1$.

FIG. 2A shows memory device 200 having six memory cell strings 230 and corresponding control gates and select circuits 260 and 261 as an example. However, memory device 200 can have numerous memory cell strings 230 and corresponding control gates and select circuits 260 and 261.

As shown in FIG. 2A, each memory cell string 230 can be associated with (can be coupled to) a respective select circuit 260 and a respective select circuit 261. Select circuits 261 and 260 can correspond to drain select gate (SGD) and source select gate (SGS) circuits, respectively, of a memory device such as a NAND flash memory device. Each memory cell string 230 can include memory cells (e.g., memory cells 210, 211, 212, and 213 in FIG. 2B) connected in series between a respective select circuit 260 and a respective select circuit 261.

Memory device 200 can include select lines (e.g., drain select lines) associated with signals (e.g., select signals) $SGDr_0$ and $SGDw_0$, and select lines (e.g., drain select lines) associated with signals (e.g., drain select signals) $SGDr_1$ and $SGDw_1$. The select lines associated with signals $SGDr_0$ and $SGDw_0$ can be electrically separated from the select lines associated with signals $SGDr_1$ and $SGDw_1$.

Memory device 200 can include select lines (e.g., source select lines) associated with signals (e.g., source select signals) $SGSr_0$ and $SGSw_0$, and select lines (e.g., source select lines) associated with signals (e.g., source select signals) $SGSr_1$ and $SGSw_1$. The select lines associated with signals $SGSr_0$ and $SGSw_0$ can be electrically separated from select lines associated with signals $SGSr_1$ and $SGSw_1$.

As shown in FIG. 2A, the select lines associated with signals $SGDr_0$ and $SGDw_0$ can be coupled (e.g., can be shared by) one group (e.g., a group of three) of select circuits 261. The select lines associated with signals $SGDr_1$ and $SGDw_1$ can be coupled (e.g., can be shared by) another group (e.g., another group of three) of select circuits 261.

The select lines associated with signals $SGSr_0$ and $SGSw_0$ can be coupled (e.g., can be shared by) one group (e.g., a group of three) of select circuits 260. Select lines associated with signals $SGSr_1$ and $SGSw_1$ can be coupled (e.g., can be shared by) another group (e.g., another group of three) of select circuits 260.

Memory device 200 can selectively activate (e.g., turn on or turn off) select circuits 260 and 261 during a memory operation (e.g., read write operation) of memory device 200 using corresponding select lines coupled to select circuits 260 and 261. Memory device 200 can activate one or both of select circuit 260 and 261 associated with a selected memory cell string 230, depending on which memory operation (e.g., read or write operation) that memory device 200 performs on the selected memory cell strings 230. A selected memory cell string is the memory cell string (among memory cell strings 230) that memory device 200 selects to store information in or read information from a memory cell (e.g., one of memory cells 210, 211, 212, and 213 in FIG. 2B) of that memory cell string.

Data lines 270, 271, and 272 can be used to carry signals (e.g., bit line signals) BL0, BL1, and BL2, respectively, and can be coupled to respective memory cell strings 230. Each of data lines 270, 271, and 272 can be structured as a conductive line that can includes conductive materials. Examples of such conductive materials include conductively doped polycrystalline silicon (doped polysilicon), metals, or other conductive materials. FIG. 2A shows three data lines of memory device 200 as an example. However, memory device 200 includes numerous data lines.

Each source 290 can be structured as a conductive line (e.g., a source line) or a conductive plate (e.g., conductive region) of memory device 200. Source 290 can be used to carry a signal (e.g., a source line signal) SL. FIG. 2A shows two separate sources 290 coupled to two corresponding groups of memory cell strings 230. However, memory device 200 can include a source (e.g., a single source) that is common (e.g., common source region) in both groups of memory cell strings 230 shown in FIG. 2A.

The control gates of memory device 200 can be part of word lines of memory device 200. The word lines can be part of access lines of memory device 200 (like access lines 150 of memory device 100 of FIG. 1). As shown in FIG. 2A, the control gates associated with signals $WL0r_0$, $WL0w_0$, $WL1r_0$, $WL1w_0$, $WL2r_0$, $WL2w_0$, $WL3r_0$, and $WL3w_0$ can be electrically separated from the gates associated with signals $WL0r_1$, $WL0w_1$, $WL1r_1$, $WL1w_1$, $WL2r_1$, $WL2w_1$, $WL3r_1$, and $WL3w_1$.

The control gate associated with signals $WL0r_0$, $WL0w_0$, $WL1r_0$, $WL1w_0$, $WL2r_0$, $WL2w_0$, $WL3r_0$, and $WL3w_0$ can be coupled (e.g., can be shared by) one group of memory cell strings 230 (e.g., a group of three memory cell strings in the example of FIG. 2A). The control gate associated with signals $WL0r_1$, $WL0w_1$, $WL1r_1$, $WL1w_1$, $WL2r_1$, $WL2w_1$, $WL3r_1$, and $WL3w_1$ can be coupled (e.g., can be shared by) another group (e.g., another group of three) of memory cell strings 230.

In the description herein, letter "r" (for "read") next to a numerical label of a control gate, a select line, or a signal, indicates that such a control gate, a select line, or a signal, can be activated during a read operation and deactivated during a write operation of the memory device (e.g., memory device 200) described herein.

Letter "w" (for "write") next to a numerical label of a control gate, a select line, or a signal, indicates that such a control gate, a select line, or a signal, can be activated during a write operation (or during an erase) and deactivated during a read operation of the memory device (e.g., memory device 200) described herein.

FIG. 2B shows a schematic diagram of memory cell string 230 and associated control gates 250r, 250w, 251r, 251w, 252r, 252w, 253r, and 253w, which have corresponding signals WL0r, WL0w, WL1r, WL1w, WL2r, WL2w, WL3r, and WL3w. The control gates having labels with letter "r" can be called read control gates. For example, control gates 250r, 251r, 252r, and 253r can be called read control gates. The read control gates can be activated (e.g., coupled to a positive voltage) during a read operation and deactivated (e.g., coupled to ground or a voltage less than 0V) during a write operation.

The control gates having labels with letter "w" can be called write control gates. For example, control gates 250w, 251w, 252w, and 253w can be called write control gates. The write control gates can be activated (e.g., coupled to a positive voltage) during a write operation and deactivated (e.g., coupled to ground or to a voltage less than 0V) during a read operation.

The select lines having labels with letter "r" can be called read select lines. For example, select lines 280r and 281r can be called read select lines. The read select line can be activated (e.g., coupled to a positive voltage) during a read operation and deactivated (e.g., coupled to ground or to a voltage less than 0V) during a write operation. The select lines having labels with letter "w" can be called write select lines. For example, select lines 280w and 281w can be called write select lines. The write select lines can be activated (e.g., coupled to a positive voltage) during a write operation and deactivated (e.g., coupled to ground or to a voltage less than 0V) during a read operation.

FIG. 2B shows an example, where select lines 281r and 281w are separated (electrically separated) from each other. In alternative structure of memory device 200, select lines 281r and 281w can be electrically coupled to each other. In such an alternative structure, a single signal (instead to two separate signals shown in FIG. 2B) can be used to control select lines 281r and 281w. Similarly, FIG. 2B shows an example where select lines 280r and 280w are separated (electrically separated) from each other. Alternatively, select lines 280r and 280w can be electrically coupled to each other. In such an alternative structure, a single signal (instead of two separate signals shown in FIG. 2B) can be used to control select lines 280r and 280w.

Control gates 250r, 250w, 251r, 251w, 252r, 252w, 253r, and 253w in FIG. 2B correspond to the control gates associated with signals $WL0r_0$, $WL0w_0$, $WL1r_0$, $WL1w_0$, $WL2r_0$, $WL2w_0$, $WL3r_0$, and $WL3w_0$, respectively, of FIG. 2A. Control gates 250r, 250w, 251r, 251w, 252r, 252w, 253r, and 253w also correspond to the control gates associated with signals $WL0r_1$, $WL0w_1$, $WL1r_1$, $WL1w_1$, $WL2r_1$, $WL2w_1$, $WL3r_1$, and $WL3w_1$, respectively, of FIG. 2A.

Select circuit 261 of FIG. 2B corresponds to one of select circuits 261 of FIG. 2A. As shown in FIG. 2B, select circuit 261 can include a select transistor (e.g., drain select transistor) 261D. Select transistor 261D can be controlled (e.g., turned on or turned off) by select line (e.g., drain select lines) 281r or 281w. Select lines and 281r and 281w associated with select circuit 261 correspond to the select lines associated with select signals $SGDr_0$ and $SGDw_0$, respectively, of FIG. 2A, and the select lines associated with select signals $SGDr_1$ and $SGDw_1$, respectively, of FIG. 2A.

Select circuit 260 of FIG. 2B corresponds to one of select circuits 260 of FIG. 2A. As shown in FIG. 2B, select circuit 260 can include a select transistor (e.g., source select transistor) 260S. Select transistor 260S can be controlled (e.g., turn on or turned off) by select line (e.g., drain select lines) 280r or 280w. Select lines (e.g., source select lines) 280r and 280w associated with select circuit 260 can correspond to the select lines associated with select signals $SGSr_0$ and $SGSw_0$, respectively, of FIG. 2A. Select lines 280r and 280w of FIG. 2B can also correspond to the select lines associated with select signals $SGSr_1$ and $SGSw_1$, respectively, of FIG. 2A.

As shown in FIG. 2B, memory cells 210, 211, 212, and 213 of memory cell string 230 can be coupled in series with each other between select transistors 260S and 261D. Each of memory cells 210, 211, 212, and 213 can include a charge storage structure 202. Charge storage structure 202 can form the memory element of a respective memory cell (among memory cells 210, 211, 212, and 213) of memory cell string 230. Charge storage structure 202 can include a material (or materials) that can be structured to store charge (e.g., can trap charge). Example materials for charge storage structure 202 include a dielectric material (e.g., silicon nitride). Alternatively, charge storage structure 202 can include polysilicon.

The value (e.g., digital value) of information stored in a particular memory cell (among memory cells 210, 211, 212, and 213) can be based on the amount of charge in charge storage structure 202 of that particular memory cell. Charge storage structure 202 can be configured such that each memory cell can be configured to store a single bit or multiple bits of information.

As shown in FIG. 2B, each of memory cells 210, 211, 212, and 213 can be associated with (e.g., can be coupled to) two respective control gates, in which the control gates are electrically separated from each other. For example, memory cell 210 can be associated with control gates 250r and 250w that are electrically separated from each other. Memory cell 211 can be associated with (e.g., can be coupled to) control gates 251r and 251w that are electrically separated from each other. Memory cell 212 can be associated with (e.g., can be coupled to) control gates 252r and 252w that are electrically separated from each other. Memory cell 213 can be associated with (e.g., can be coupled to) control gates 253r and 253w that are electrically separated from each other.

In a read operation to read information from a selected memory cell, the read control gate associated with the selected memory cell can be activated, and the write control gate associated with the selected memory cell can be deactivated. For example, in a read operation to read information from memory cell 210 (selected memory cell), control gate 250r can be activated by, for example, applying a positive voltage to control gate 250r (e.g., providing signal WL0r with a positive voltage). In this example, control gate 250w can be deactivated by, for example, coupling control gate 250w to ground (e.g., 0V) or to a negative voltage (e.g., providing signal WL0w with 0V or with a negative voltage).

In a write operation to store information in a selected memory cell, the write control gate associated with the selected memory cell be activated, and the read control gate associated with the selected memory cell can be deactivated. For example, in a write operation to store information in memory cell 210 (selected memory cell), control gate 250w can be activated by, for example, applying a positive voltage to control gate 250w (e.g., providing signal WL0w with a positive voltage). In this example, control gate 250r can be deactivated by, for example, coupling control gate 250r to ground (e.g., 0V) or to a negative voltage (e.g., providing signal WL0w with 0V or with a negative voltage).

In a read operation, the read control gates coupled to unselected memory cells (e.g., memory cells 211, 212, and 213 in the above example) can be provided with a voltage (e.g., positive voltage) to cause the unselected memory cells (non-selected memory cells) to operate as conductive elements (e.g., as turned-on switches). In a write operation, the write control gates coupled to non-selected memory cells (e.g., memory cells 211, 212, and 213 in the above example) can be provided with a voltage (e.g., a positive voltage) to cause the unselected memory cells to operate as conductive elements (e.g., as turned-on switches).

In an erase operation, the memory cells (e.g., memory cells 210, 211, 212, and 213) of memory cell string 230 can be concurrently selected.

The read control gates can be deactivated. The write control gates can be applied with a relatively large negative voltage (e.g., −20V) to erase information from the memory cells (e.g., memory cells 210, 211, 212, and 213) of memory cell string 230.

Figure 3A:
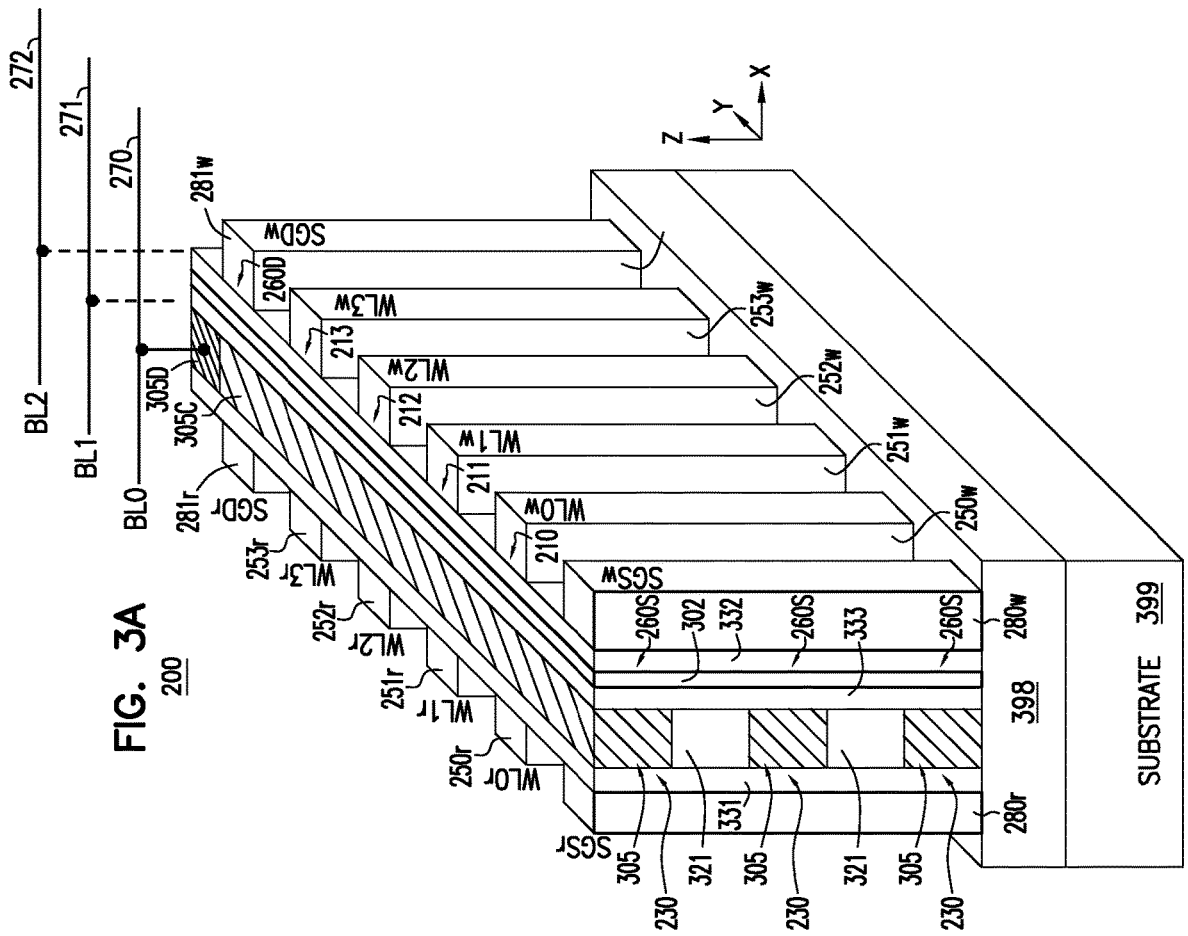
FIG. 3A through FIG. 3E show different views of a structure of a portion of the memory device of FIG. 2A and FIG. 2B including structures of memory cell strings and read and write control gates, according to some embodiments described herein.

FIG. 3A through FIG. 3E show different views of a structure of a portion of memory device 200 including the structures of memory cell strings 230 and read and write control gates, according to some embodiments described herein. Some of the elements of the structure of the portion of memory device 200 shown in FIG. 3A are schematically shown in FIG. 2A and FIG. 2B. For simplicity, the same elements of memory device 200 shown in FIG. 2A, FIG. 2B, and FIG. 3A are given the same labels. Details of the same elements area not repeated.

For simplicity, cross-sectional lines (e.g., hatch lines) are omitted from most of the elements shown in FIG. 3A and other figures in the drawings described herein. Some elements of memory device 200 (and other memory devices described herein) may be omitted from a particular figure of the drawings so as to not obscure the description of the element (or elements) being described in that particular figure. The dimensions (e.g., physical structures) of the elements shown in the drawings described herein are not scaled.

FIG. 3A shows a 3-dimensional view (e.g., isometric views) in the X, Y, and Z directions of memory device 200 including three memory cell strings 230 having respective memory cells 210, 211, 212, and 213. Only the memory cells 210, 211, 212, and 213 of the top memory cell string 230 (top memory cell string) are labeled in FIG. 3A.

As shown in FIG. 3A, memory cell strings 230 can be formed over a dielectric structure 398, which can be formed over substrate 399. Dielectric structure 398 can electrically separate other elements (e.g., memory cell strings, charge storage structures, and control gates) of memory device 200 from substrate 399. Dielectric structure 398 can include silicon dioxide or other dielectric material.

Substrate 399 of memory device 200 can include monocrystalline (also referred to as single-crystal) semiconductor material. For example, substrate 399 can include monocrystalline silicon (also referred to as single-crystal silicon). The monocrystalline semiconductor material of substrate 399 can include impurities, such that substrate 399 can have a specific conductivity type (e.g., n-type or p-type).

As shown in FIG. 3A, control gates (e.g., read control gates) 250r, 251r, 252r, and 253r can have respective lengths in the Z-direction, which is a direction between memory cell string 230 and substrate 399. Similarly, control gates (e.g., write control gates) 250w, 251w, 252w, and 253w can have respective lengths in the Z-direction (a direction between memory cell string 230 and substrate 399). As shown in FIG. 3A, each of the read and write control gates can have a width in the Y-direction and a thickness in the X-direction. In a read or write control gate, the width and the thickness are less than the length.

Memory device 200 can include channel structures 305 separated from each other in the Z-direction by respective dielectric structures 321. Memory device 200 can include a dielectric structure 331 between channel structures 305 and control gates (e.g., read control gates) 250r, 251r, 252r, and 253r, and between channel structures 305 and select lines (e.g., read select lines) 280r and 281r. Dielectric structure 331 can be a read gate oxide for respective memory cell strings (e.g., three memory cell strings shown in the example of FIG. 3A) of memory device 200.

Memory device 200 can include a combination of a dielectric structure 332, a material (e.g., charge storage material) 302, and a dielectric structure 333 between channel structures 305 and control gates (e.g., write control gates) 250w, 251w, 252w, and 253w, and between channel structures 305 and select lines (e.g., write select lines) 280w and 281w.

To avoid crowding the structure of memory device 200, a portion of memory device 200 near select lines (e.g., read and write lines) 280r and 280w is not shown in FIG. 3A. However, such a portion (which includes portions 305S) is shown in FIG. 3C and FIG. 3D (described in more detail below). As shown in FIG. 3A, channel structure 305 of a respective memory cell string 230 can include a portion (e.g., channel portion) 305C and a portion (e.g., drain portion) 305D. Although not shown in FIG. 3A, channel structure 305 of a respective memory cell string 230 can also include a portion (e.g., source portion) 305S (shown in FIG. 3C and FIG. 3D) coupled to portion 305C, such that portion 305C is between portions 305D and 305S. These portions 305C, 305D, and 305S can have different doping concentrations (described in more detail below).

Figure 3B:
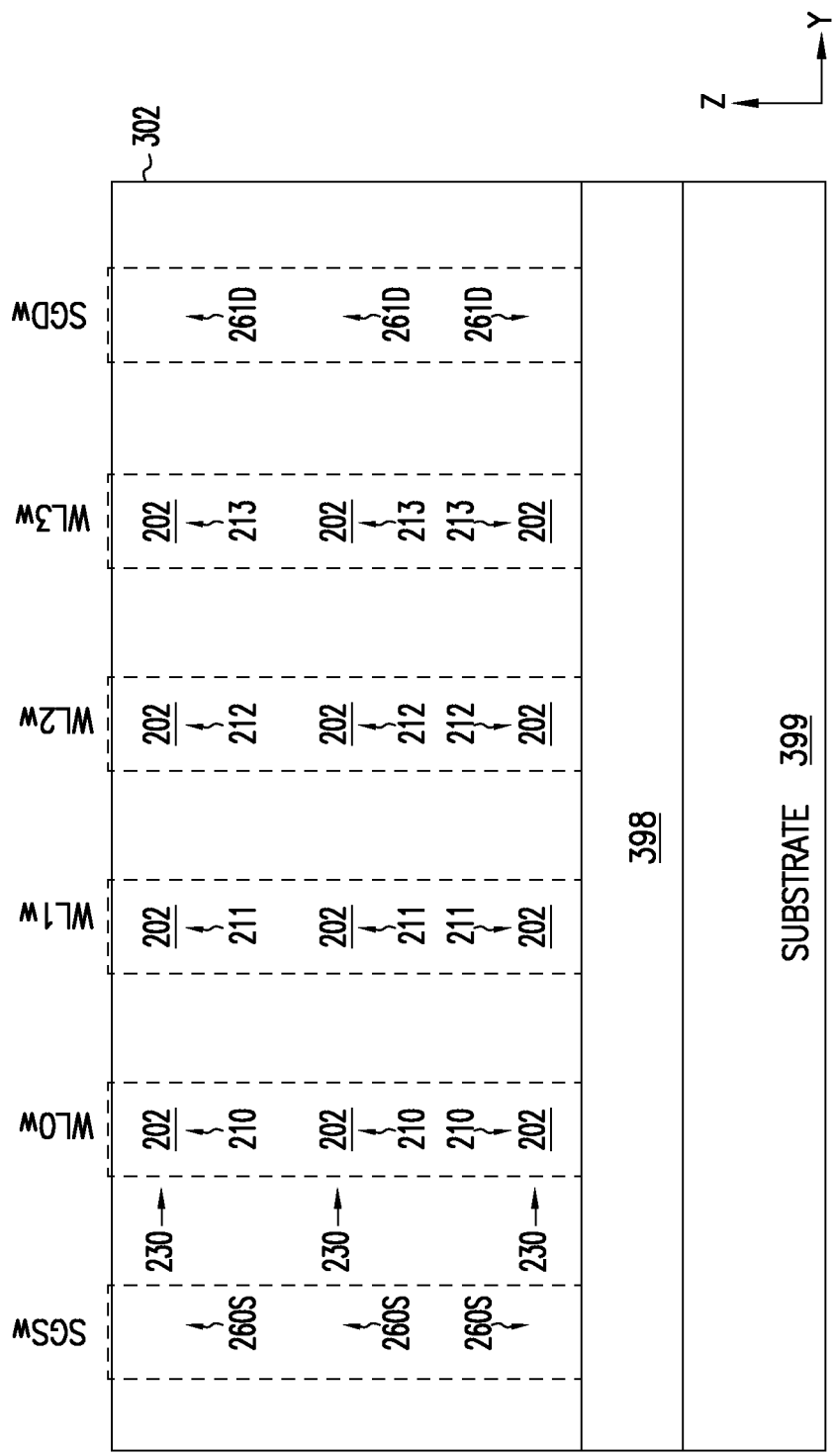
Figure 3C:
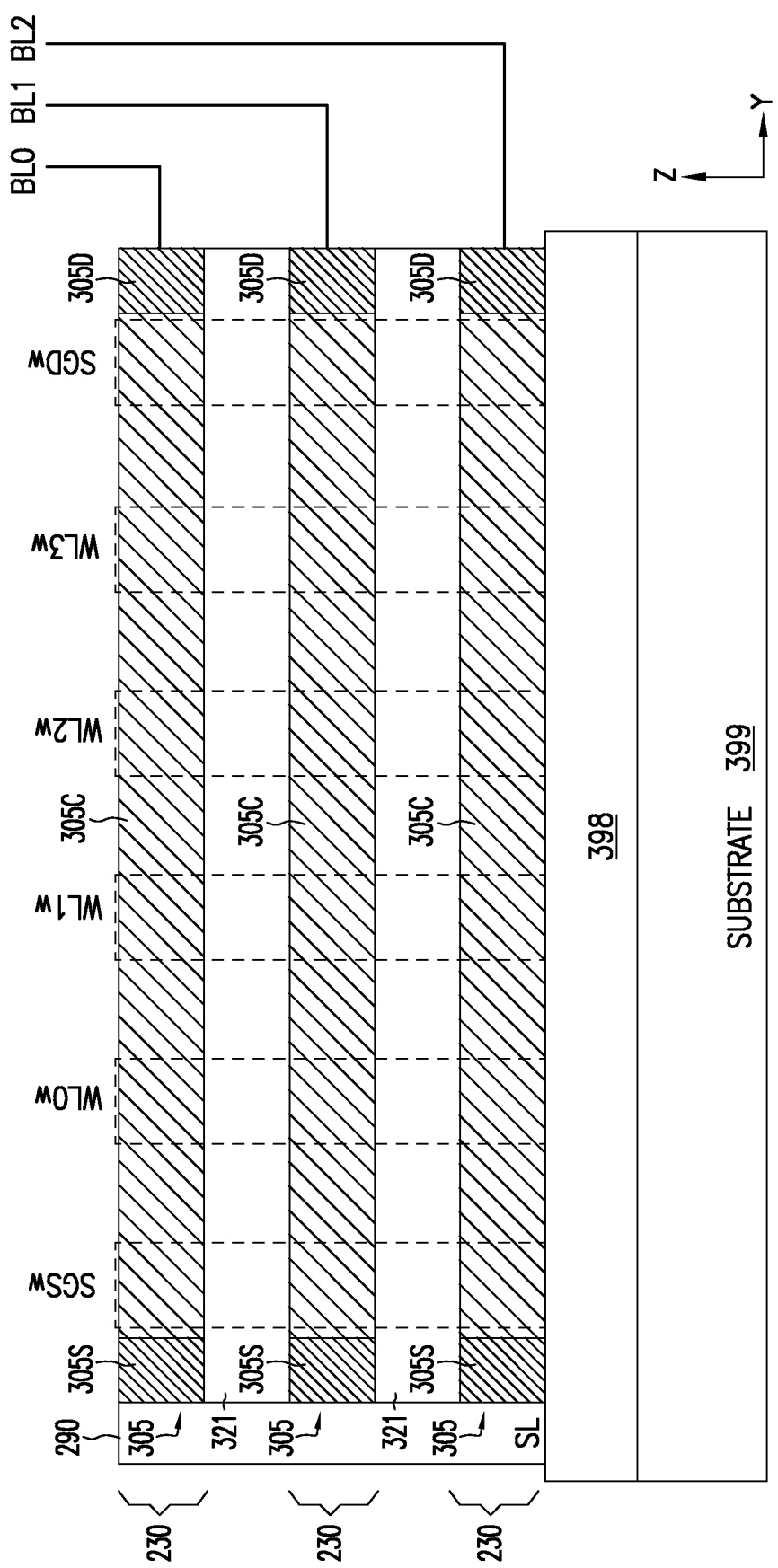
Figure 3D:
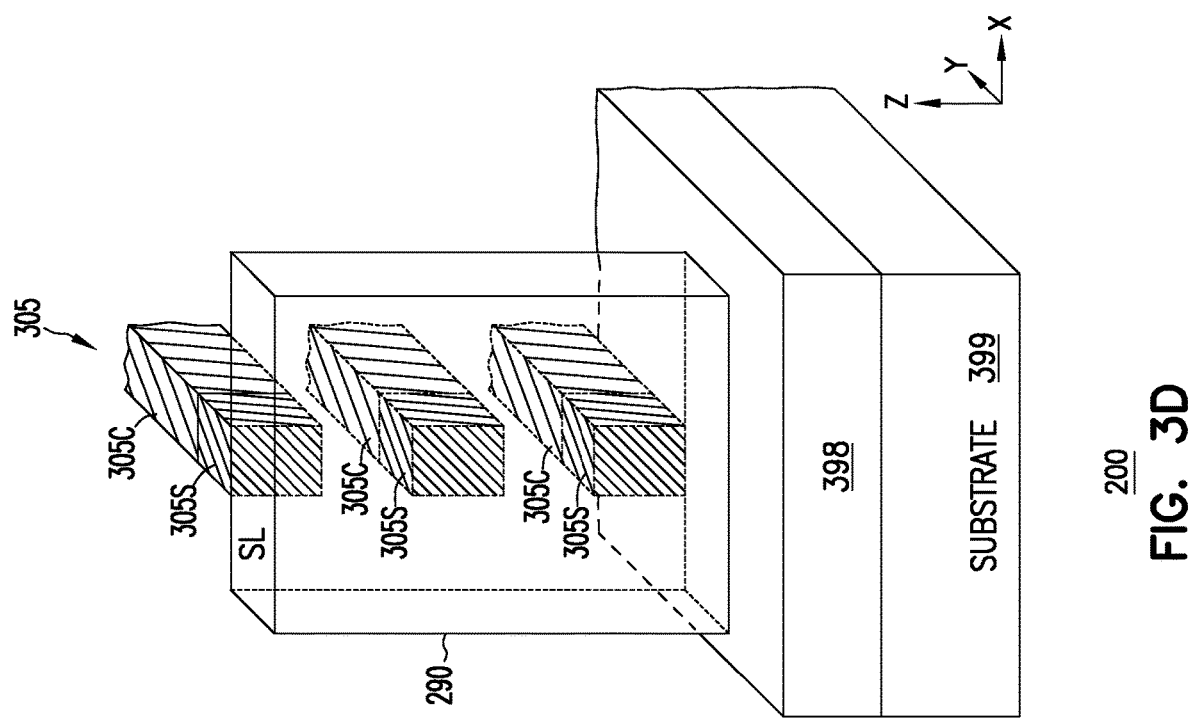

FIG. 3B shows a cross section of memory device 200 at material 302 of FIG. 3A in the Y-Z directions. As shown in FIG. 3B, charge storage structures 202 of respective memory cells 210, 211, 212, and 213 can be formed from respective portion of material 302. Material 302 can be structured to store charge (e.g., can trap charge). Examples for material 302 include a dielectric material (e.g., silicon nitride), polysilicon, or other charge storage materials.

As shown in FIG. 3B, the locations of memory cells 210, 211, 212, and 213 of a particular memory cell string 230 can be at or near the locations of respective charge storage structures 202 of that particular memory cell string 230. As shown in FIG. 3A and FIG. 3B, memory cell strings 230 can be located (e.g., formed) one over another in the Z-direction, which is perpendicular to substrate 399 (e.g., perpendicular to the X-Y plane of substrate 399). The direction from one memory cell to the next (from memory cell 210 to memory cell 211) within the same memory cell string 230 is the Y-direction, which is perpendicular to substrate 399 (e.g., perpendicular to the X-Y plane of substrate 399).

In FIG. 3B, the locations of the write control gates (associated with signals WL0w, WL1w, WL2w, and WLw3) are shown in dashed lines. The read control gates (not labeled in FIG. 3B) are hidden behind the write control gates in the view of FIG. 3B. FIG. 3B also shows the locations of select transistors 260S and 260D relative to the locations of memory cells 210, 211, 212, and 213 of a respective memory cell string 230.

FIG. 3C shows a cross section of memory device 200 at channel structures 305 in FIG. 3A in the Y-Z directions. FIG. 3D shows a 3-dimensional view (e.g., isometric views) in the X, Y, and Z directions of a portion of memory device 200 of FIG. 3A and FIG. 3C. As shown in FIG. 3C, each channel structure 305 can have a length extending continuously in the Y-direction. As shown in FIG. 3A and FIG. 3C, channel structures 305 can have non-cylindrical structures. For example, channel structures 305 can be a rectangular prism or close to rectangular prism (as shown in FIG. 3A).

As shown in FIG. 3A, FIG. 3C, and FIG. 3D, channel structures 305 can be coupled to source (associated with signal SL) 290 and to respective data lines (associated with signal BL0, BL1, and BL2), respectively, of memory device 200. Source 290 in FIG. 3C and FIG. 3D is schematically shown (e.g., shown as a line) in FIG. 3A. However, as shown in FIG. 3C and FIG. 3D, source 290 can be structured as a conductive plate (e.g., conductive region formed from a piece (e.g., a layer) of conductive material) that contacts channel structures 305 of respective memory cell strings 230. As shown in FIG. 3A and FIG. 3C, channel structures 305 are separated from each other in the Z-direction by respective dielectric structures 321. Channel structure 305 can include a material (e.g., a conductive material) that can conduct a current. Example materials for channel structure 305 include polysilicon (e.g., doped or undoped polysilicon). Channel structure 305 can operate to conduct current to a respective memory cell string 230. In a memory operation (e.g., read operation), each channel structure 305 can conduct a current (e.g., electrons) between source 290 and respective data line among data lines 270, 271, and 272.

Portions 305C, 305D, and 305S can include conductively doped polycrystalline silicon (conductively doped polysilicon). Portions 305C, 305D, and 305S can have the same type of dopants. For example, portions 305C, 305D, and 305S can have N-type dopants (or alternatively P-type dopants). In an example, each of portions 305D and 305S can have a higher doping concentration than portion 305C. For example, each of portions 305D and 305S can be heavily doped with N-type dopant (e.g., N+ (N plus)) type), and portion 305C can be lightly doped with N-type dopant (e.g., N− (N minus) type). Alternatively, each of portions 305D and 305S can be heavily doped with P-type dopant (e.g., P+ (P plus)) type), and portion 305C can be lightly doped with P-type dopant (e.g., P− (P minus) type).

Source 290 (FIG. 3C and FIG. 3D) can include conductively doped polysilicon. Source 290 and portions 305S can have the same material. Source 290 and portions 305S can have the same doping concentration. For example, source 290 and portions 305S can have N-type dopants (e.g., N+ type) or alternatively P-type dopants (e.g., P+ type).

Figure 3E:
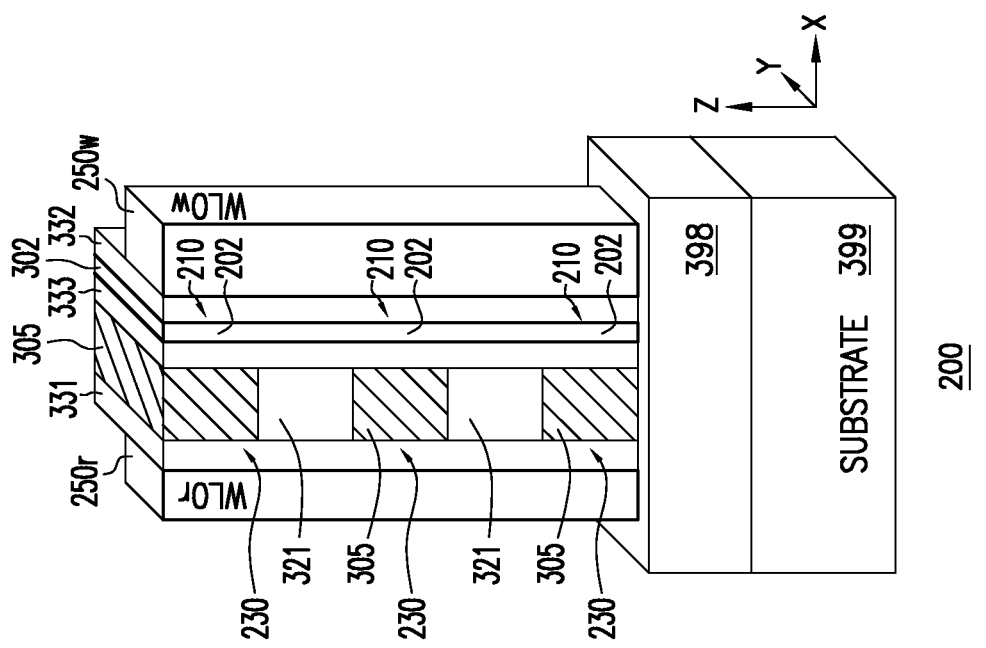

FIG. 3E shows a portion memory device 200 of FIG. 3A including three memory cells 210 from three respective memory cell strings 230, according to some embodiments described herein. For simplicity, the following description describes the structure of memory cell 210 of one of memory cell strings 230 and other elements (e.g., control gates and channel structure) associated with memory cell 210. The other memory cells (e.g., memory cells 211, 212, and 213 in FIG. 3A) and their associated elements can have similar or the same structures as those described herein for memory cell 210.

As shown in FIG. 3E, memory cell 210 can include including dielectric structure (e.g., read gate oxide) 331 between control gate (e.g., read control gate) 250r. Thus, control gate 250r can be separated from charge storage structure 202 by dielectric structure 331. Memory cell 210 can include charge storage structure 202 between dielectric structure 332 and dielectric structure 333. Charge storage structure 202 and dielectric structures 332 and 333 can be located between channel structure 305 and control gate (e.g., write control gate) 250w.

As shown in FIG. 3E, control gate 250r and control gate 250w can be located on opposite sides (in the X-direction) of charge storage structures 202, and opposite sides of channel structure 305. For example, control gate 250r and control gate 250w can be located one left and right side (in the X-direction), respectively, of charge storage structures 202. Control gate 250r and control gate 250w can also be located on the left and right sides (in the X-direction), respectively, of channel structure 305.

Dielectric structure 332 can be configured to facilitate tunneling of charge (e.g., holes or electrons) between charge storage structure 202 and control gate 250w. Dielectric structure 333 can be configured to block tunneling of charge between charge storage structure 202 and control gate 250w. For example, in a write operation to store information in memory cell 210, dielectric structure 332 can facilitate tunneling of electrons from control gates 250w to charge storage structure 202. In another example, in an erase operation to erase information (e.g., previously stored information) from memory cell 210, dielectric structure 332 can facilitate tunneling of electrons from charge storage structure 202 to control gates 250w, tunneling of holes from control gates 250w to charge storage structure 202, or both.

In an alternative structure of memory device 200, dielectric structure 333 can be configured to facilitate tunneling of charge (e.g., holes or electrons) between charge storage structure 202 and control gate 250w. Dielectric structure 332 can be configured to block tunneling of charge between charge storage structure 202 and control gate 250w. For example, in a write operation to store information in memory cell 210 in the alternative structure, dielectric structure 333 can facilitate tunneling of electrons from control gates 250w to charge storage structure 202. In another example, in an erase operation to erase information (e.g., previously stored information) from memory cell 210 in the alternative structure, dielectric structure 333 can facilitate tunneling of electrons from charge storage structure 202 to control gates 250w, tunneling of holes from control gates 250w to charge storage structure 202, or both.

Separate read and write control gates in memory device 200 as described above with reference to FIG. 2A through FIG. 3E can improve (e.g., increase) program-erase (P/E) window in memory device 200. For example, with separate read control gates, channel structure 305 and dielectric structure (e.g., read gate oxide) 331 in FIG. 3A and FIG. 3E can be formed with respective thicknesses (in the X-direction) to achieve suitable program-erase (P/E) window in memory device 200. The thickness of dielectric structure 331 can be less than the thickness of channel structure 305.

As an example, channel structure 305 can have a thickness in a range from 9 nanometers (nm) to 11 nanometers and dielectric structure 331 can have thickness in a range from 2 nanometer to 10 nanometers. The thicknesses described herein are example thicknesses. Other thicknesses can be used. However, using the thicknesses described herein may be more beneficial in achieving a relatively larger range for the program-erase window of memory device 200. The program-erase window can be proportional to the thickness of dielectric structure 331 for a given thickness (e.g., thickness in range from 9 nm to 11 nm) of channel structure 305. The greater the thickness (e.g., thickness in range from 2 nm to 10 nm) of dielectric structure 331, the larger the program-erase window.

Separate read and write control gates in memory device 200 can also improve performance of memory device 200. For example, with proper thickness of dielectric structure 331 (e.g., to avoid leakage of charge), separate read control gates allowing a relatively high voltage can be applied to the control gates associated with the unselected memory cells during a read operation. Such a high voltage can improve (e.g., increase) current (e.g., string current) in channel structure 305 during a read operation. This leads to improvement in memory operations (e.g., read operations) and of memory device 200 in comparison with some conventional memory devices (e.g., NAND flash memory devices).

Using separate read control gates for read operations and write control gates for write or erase operations can also reduce or prevent read disturbance in memory device 200. Further, the structure of the memory cells of memory device 200 can a relatively small footprint. This can be beneficial for device scaling.

The above description with reference to FIG. 2A through FIG. 3E describes the structure of memory device 200. Some or all of the structure of memory device 200 can be formed using processes associated with the processes described below with reference to FIG. 4A through FIG. 14C.

FIG. 4A and FIG. 4B through FIG. 14A, FIG. 14B, and FIG. 14C show different views of elements during processes of forming a memory device 400, according to some embodiments described herein. For simplicity, FIG. 4A and FIG. 4B through FIG. 14C partially show portions of memory device 400 so as not to obscure the embodiments described herein.

Figure 4A:
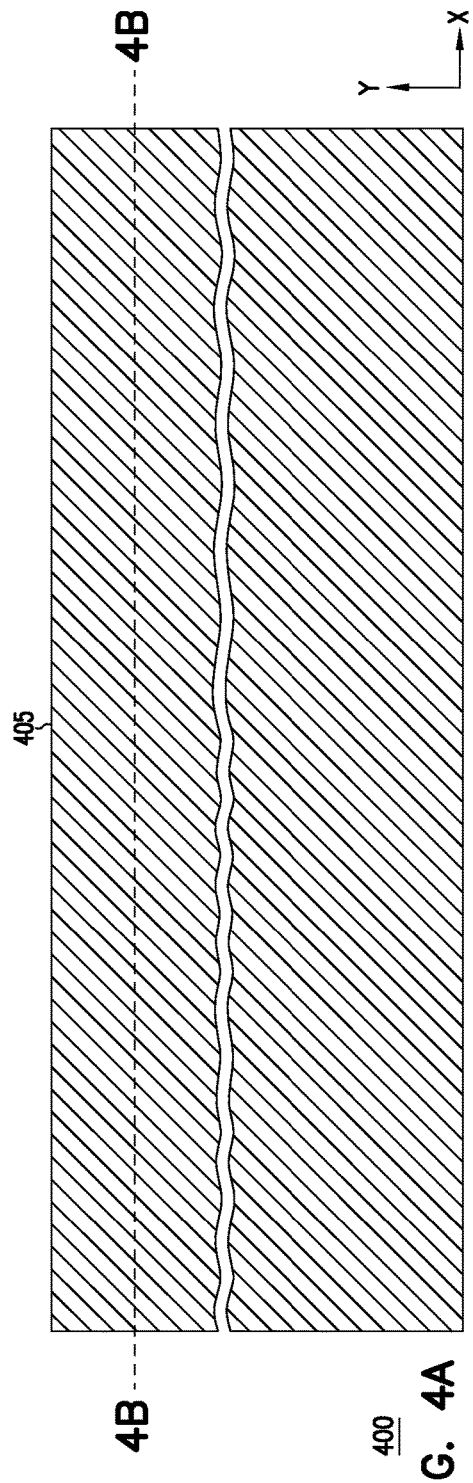
Figure 4B:
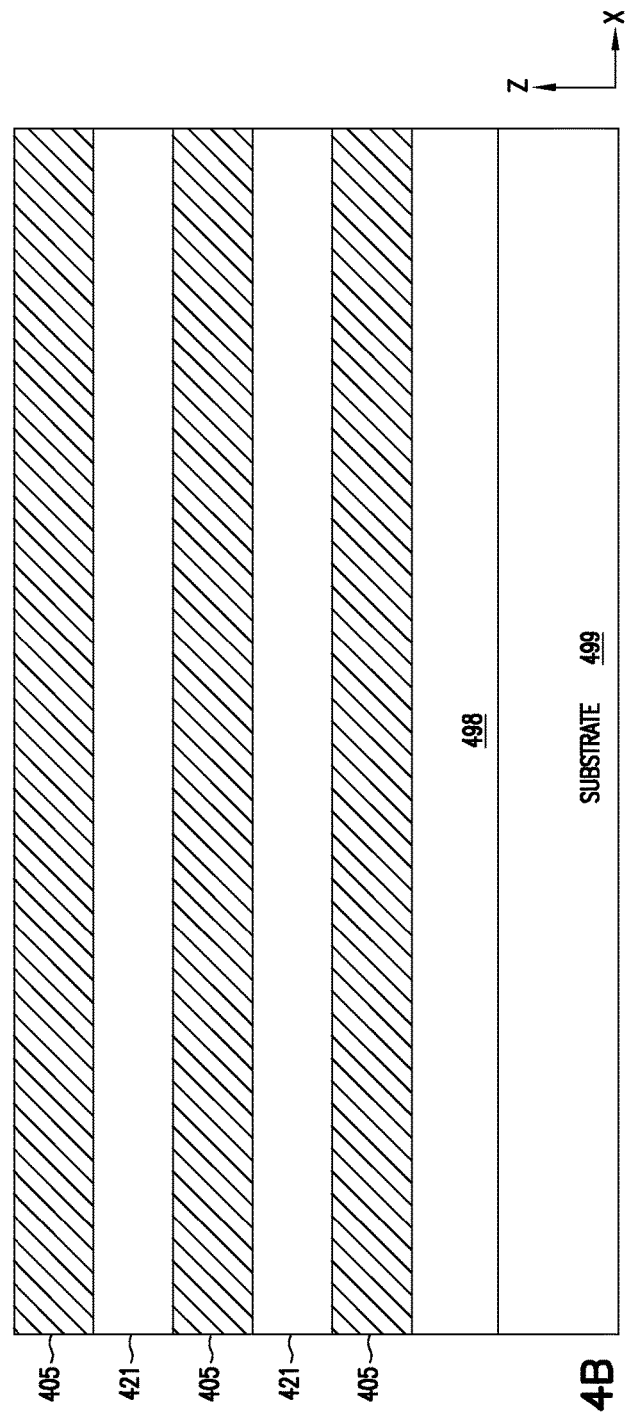

FIG. 4A and FIG. 4B show a top view (e.g., partial top view in the X-Y plane) and a side view (e.g., a cross-section in the X-Z directions), respectively, of a portion of memory device 400 after formation of a dielectric structure 498, dielectric materials (levels of dielectric materials) 421 and materials (levels of materials) 405 over a substrate 499. FIG. 4B shows the side view (e.g., cross-section) of memory device 400 taken along line 4B-4B of FIG. 4A.

Substrate 499 and dielectric structure 498 are similar to (e.g., can correspond to) substrate 399 and dielectric structure 398 (FIG. 3A) of memory device 200. Dielectric materials 421 and materials 405 can be sequentially formed one material after another over dielectric structure 498 in an interleaved fashion, such that dielectric materials 421 can be interleaved with materials 405. A blanket deposition process can be used to form materials 405 and dielectric materials 421.

Dielectric materials 421 can include silicon dioxide or other dielectric materials to electrically separate materials 405 from each other. Materials 405 can include polysilicon (e.g., doped or undoped polysilicon). In subsequent processes of forming memory device 400, materials 405 can be processed (e.g., patterned) to form channel structures (like channel structures 305 of FIG. 3A) for respective memory cell strings (like memory cell strings 230 of FIG. 3A) of memory device 400.

In the following description, different views of memory device 400 in subsequent processes are based on the views of memory device 400 of FIG. 4A and FIG. 4B and follow the same arrangement of the views (e.g., top view and side view) of FIG. 4A and FIG. 4B. For example, FIG. 4A shows a top view of memory device 400, and FIG. 4B shows a portion of memory device 400 taken along line (e.g., cross-section line) 4B-4B of FIG. 4A. For simplicity, the following description omits repeating specific views (e.g., top view and side view) and specific cross-section lines of the portion of memory device 400 from one process to the next.

In the description herein, elements given the same numerical labels are similar or the same elements. For example, channel structure 305 (FIG. 3A) and channel structure 305' (FIG. 9A and FIG. 9B) are similar or the same elements. In another example, portions 305C', 305D', and 305S' (FIG. 14C and FIG. 14D) are similar to or the same as portions 305C, 305D, and 305S, respectively (FIG. 3C and FIG. 3D). In another example, material 302' and dielectric structures 331', 332', and 333' (FIG. 6A and FIG. 6B) are similar or the same as material 302 and dielectric structures 331, 332, and 333, respectively (FIG. 3A). Thus, for simplicity, the detailed description of similar or the same elements may not be repeated.

FIG. 5A and FIG. 5B show different views of memory device 400 after lines (lines of materials) 505 are formed. Each of lines 505 include respective portions of materials 405 and dielectric materials 421. Lines 505 have lengths in the Y-direction and are separated from each other in the X-direction at respective openings 550w. Each of lines 505 can be subsequently processed (e.g., etched) to separate materials 405 in each line 505 from each other in the X-direction to form respective channel structures of memory device 400 from materials 405.

Lines 505 can be formed by forming openings (e.g., trenches) 550w through materials 405 and dielectric materials 421 (FIG. 4A and FIG. 4B) to remove a portion of materials 405 and dielectric materials 421 at openings 550w. The remaining portion of materials 405 and dielectric materials 421 in FIG. 5A and FIG. 5B form respective lines 505. As shown in FIG. 5A and FIG. 5B, openings can be trenches that have lengths extending in the Y direction. Write control gates and write select lines of memory device 400 are subsequently formed in the location of openings 950w.

FIG. 6A and FIG. 6B show different views of memory device 400 after material 302' and dielectric structures 332' and 333' (FIG. 3A) are formed. Material 302' and dielectric structures 332' and 333' can be formed one layer of material after another adjacent respective sidewalls (not labeled) of openings 550w. Then, the layers of materials may be etched to form material 302' and dielectric structures 332' and 333'. For example, a dielectric material (e.g., silicon dioxide) for dielectric structures 333' can be formed on the sidewalls of openings 550w. After the dielectric material for dielectric structures 333' are formed, a material (e.g., charge storage material (e.g., silicon nitride)) for materials 302' can be formed on the material of dielectric structures 333'. After the material for materials 302' are formed, a dielectric material (e.g., silicon dioxide) for dielectric structures 332' can be formed on the material for materials 302'. Materials 302' can form part of charge storage structures of respective memory cells of memory device 400 (like charge storage structures 202 of memory cells of memory device 200 in FIG. 3A and FIG. 3B).

FIG. 7A and FIG. 7B show memory device 400 after materials 750w are formed adjacent dielectric structures 332'. Conductive materials 750w can include conductively doped polysilicon or other conductive materials. Materials 750w can be formed by depositing materials (e.g., polysilicon) on dielectric structures 332'. In subsequent processes of forming memory device 400, conductive materials 750w can be processed (e.g., etched) to from write control gates and write select lines of memory device 400.

FIG. 8A and FIG. 8B show memory device 400 after dielectric materials 851 are formed (e.g., filled) in the spaces between opposing conductive materials 750w.

FIG. 9A and FIG. 9B show different views of memory device 400 after channel structures 305' and dielectric structures 321' are formed. Channel structures 305' is similar to (e.g., can correspond to) channel structures 305 of memory device 200 of FIG. 3A and FIG. 3D. For example, each channel structure 305' (FIG. 9A and FIG. 9B) can include portions 305C', 305D', and 305S' (not fully shown in FIG. 9A and FIG. 9B, but shown in FIG. 14C and FIG. 14D). In FIG. 9A and FIG. 9B, dielectric structures 321' is similar to (e.g., can correspond to) dielectric structures 321 of memory device 200 of FIG. 3A.

In FIG. 9A and FIG. 9B, forming channel structures 305' and dielectric structures 321' can include forming openings (e.g., trenches) 950r through materials 405 and dielectric materials 421 (FIG. 8A and FIG. 8B) to separate material 405 and dielectric materials 421 from each other in the X-direction. Openings 950r can be trenches that have lengths extending in the Y direction. Forming openings 950r can include removing (e.g., etching) a portion of materials 405 and dielectric materials 421 (FIG. 8A and FIG. 8B) at the locations of openings 950r. Read control gates and read select lines of memory device 400 are subsequently formed in the location of openings 950r.

FIG. 10A and FIG. 10B show memory device 400 after dielectric materials 1031 are formed (e.g., filled) in openings 950r.

Figure 11A:
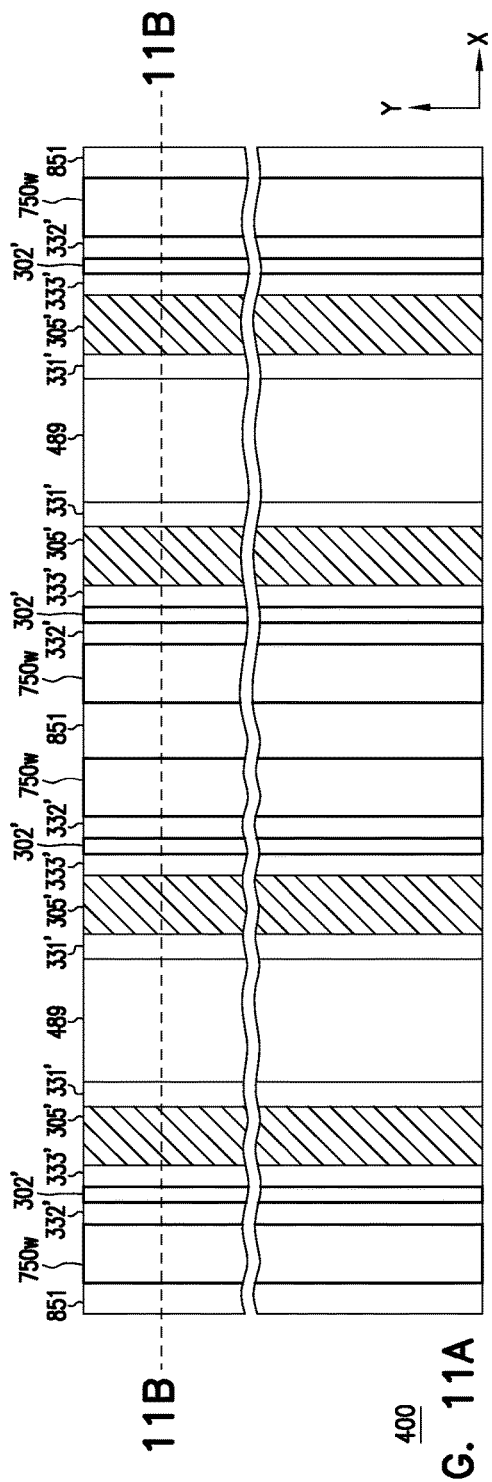
Figure 11B:
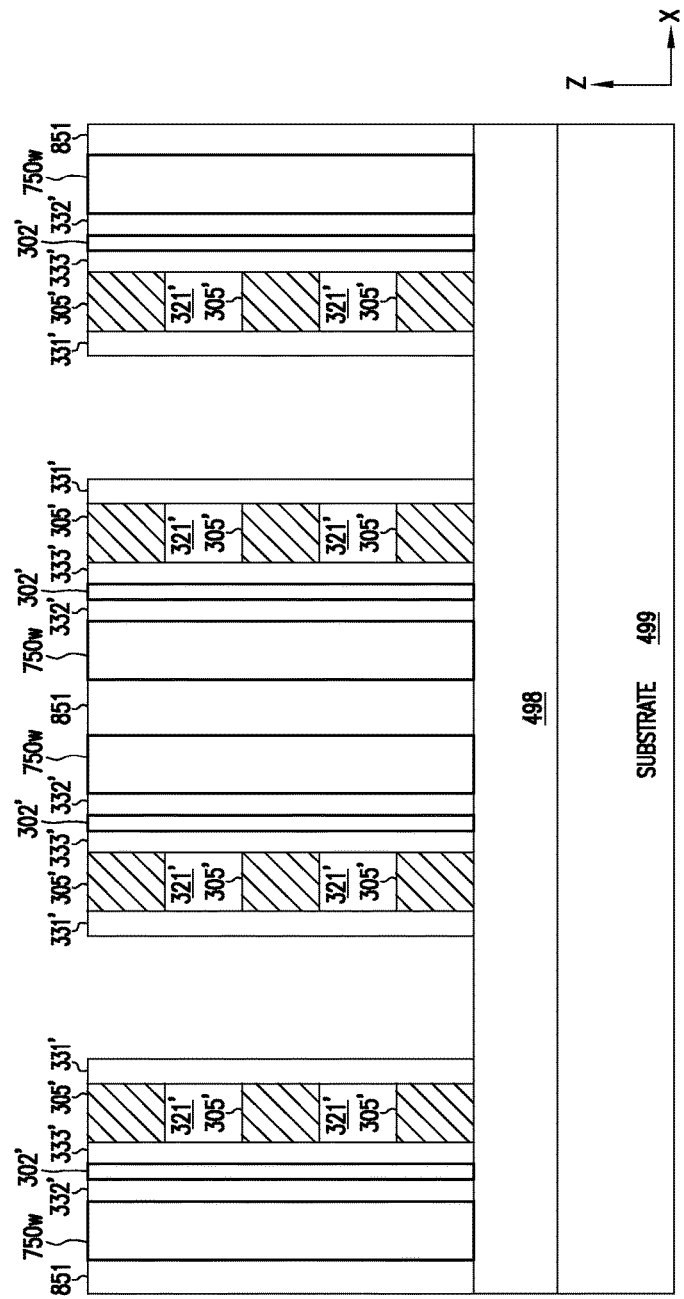

FIG. 11A and FIG. 11B show memory device 400 after dielectric structures 331' are formed adjacent respective channel structures 305'. Forming dielectric structures 331' can include removing (e.g., etching) respective portions of materials 1031 (FIG. 10). Dielectric structures 331' can be read gate oxide of memory device 400. Thus, in the processes of forming memory device 400, the read gate oxide (e.g., dielectric structures 331') can be formed after dielectric structures 332' and 333' and charge storage structure (FIG. 6A and FIG. 6B) are formed.

FIG. 12A and FIG. 12B show memory device 400 after conductive materials 1250r are formed adjacent dielectric structures 331'. Conductive materials 1250r can include conductively doped polysilicon or other conductive materials. In subsequent processes of forming memory device 400, conductive materials 1250r can be processed (e.g., etched) to from read control gates and read select lines (FIG. 14A, FIG. 14B, and FIG. 14C) of memory device 400. Thus, in the processes of forming memory device 400, the conductive materials (e.g., conductive materials 1250r) for the read control gates can be formed (in FIG. 12) after the conductive materials (e.g., conductive materials 750w in FIG. 7A and FIG. 7B) for the write control gates are formed.

FIG. 13A and FIG. 13B show memory device 400 after dielectric materials 851 (FIG. 12A and FIG. 12B) were removed (e.g., exhumed) to expose conductive materials 750w at the locations of dielectric materials 851 that were removed.

Figure 14A:
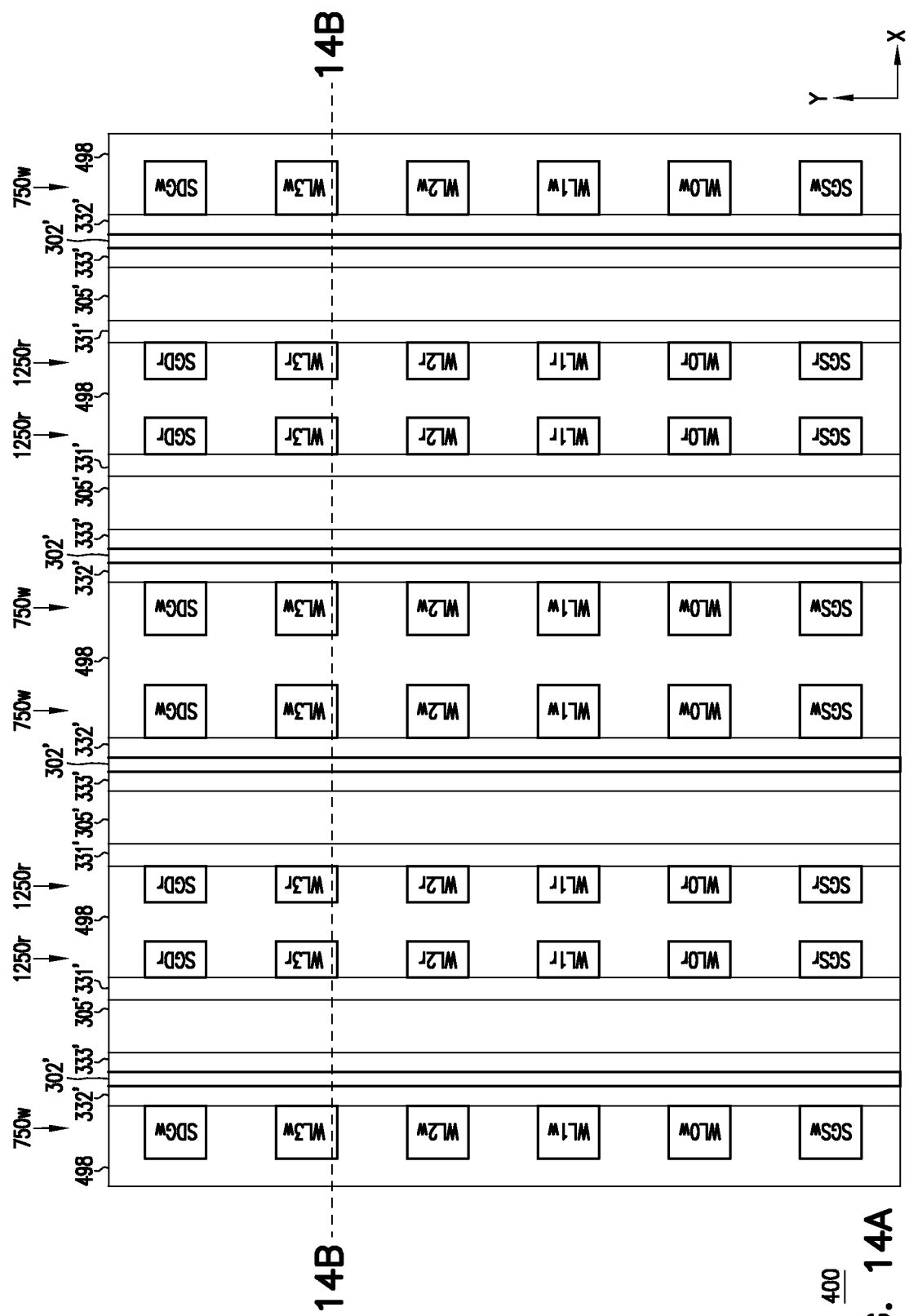
Figure 14B:
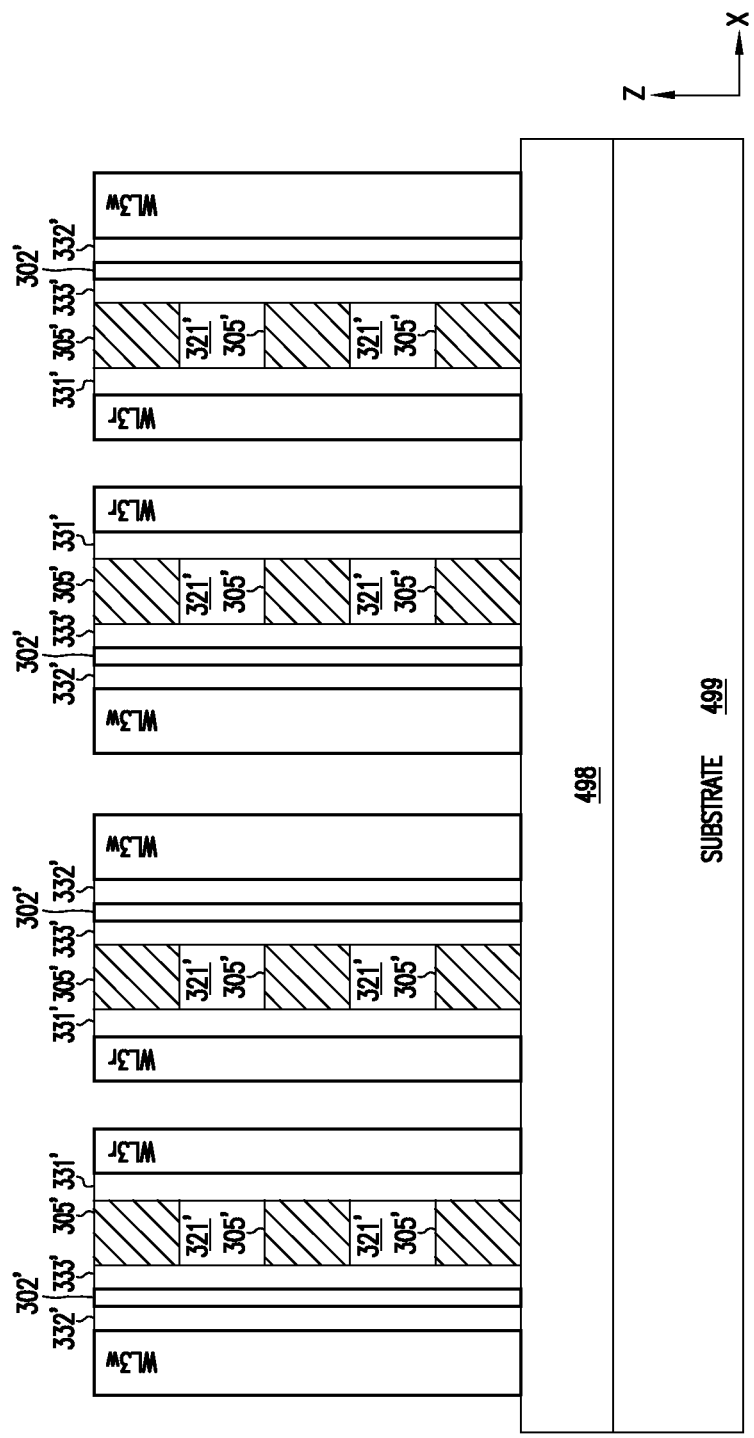
Figure 14C:
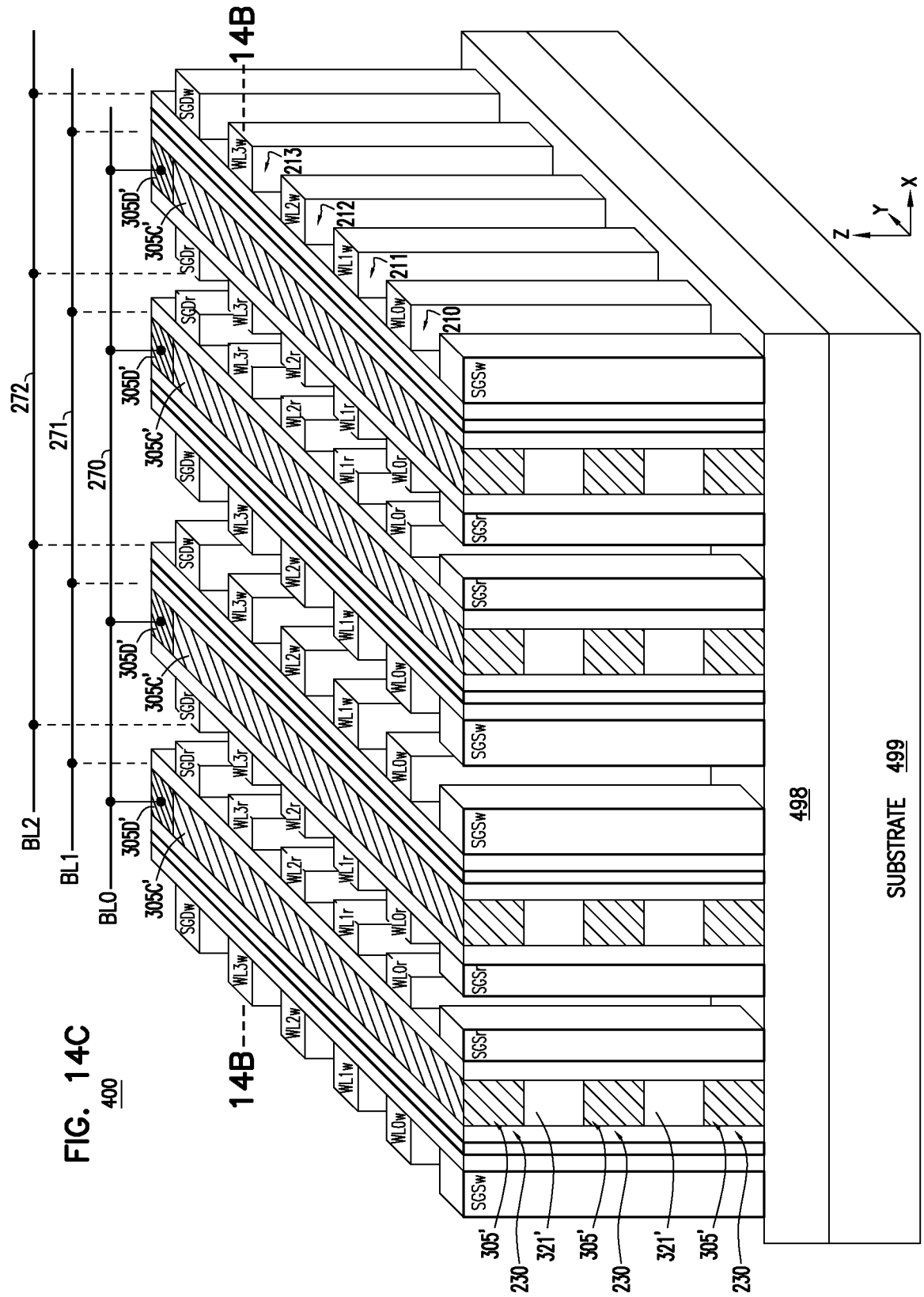

FIG. 14A, FIG. 14B, and FIG. 14C show memory device 400 after formation of read control gates (associated with signals WL0r, WL1r, WL2r, and WL3r), read select lines (associated with signals SGSr), write control gates (associated with signals WL0w, WL1w, WL2w, and WL3w), and write select lines (associated with signals SGSw). FIG. 14A shows an expanded top view (e.g., unlike the partial top views in other figures (e.g., FIG. 4A through FIG. 13A) of memory device 400. FIG. 14B shows a side view along line 14B-14B of FIG. 14A and FIG. 14C. FIG. 14C shows an additional view (e.g., isometric view) of memory device 400 in the X-Y-Z directions.

Forming the read control lines and the read select gates in FIG. 14A, FIG. 14B, and FIG. 14C can including removing (e.g., etching or patterning) a portion of conductive materials 1250r (FIG. 13A and FIG. 13B), such that the remaining portions of conductive materials 1250r form the read control lines and the read select gates as shown in FIG. 14A, FIG. 14B, and FIG. 14C.

Forming the write control lines and the write select gates in FIG. 14A, FIG. 14B, and FIG. 14C can including removing (e.g., etching or patterning) a portion of conductive materials 750w (FIG. 13A and FIG. 13B), such that the remaining portions of conductive materials 750w form the write control lines and the write select gates as shown in FIG. 14A, FIG. 14B, and FIG. 14C.

As shown in FIG. 14C, additional processes can be performed to form data lines 270, 271, and 272 (associated with signals BL0, BL1, and BL2, respectively) that are electrically coupled to respective channel structures 305'. For simplicity, data lines 270, 271, and 272 are symbolically shown in FIG. 14C. Other additional processes can also be performed to form sources 290 (associated with signal SL) that are symbolically shown in FIG. 14C. Sources 290 can be formed to electrically couple to respective channel structures 305'.

Figure 14D:
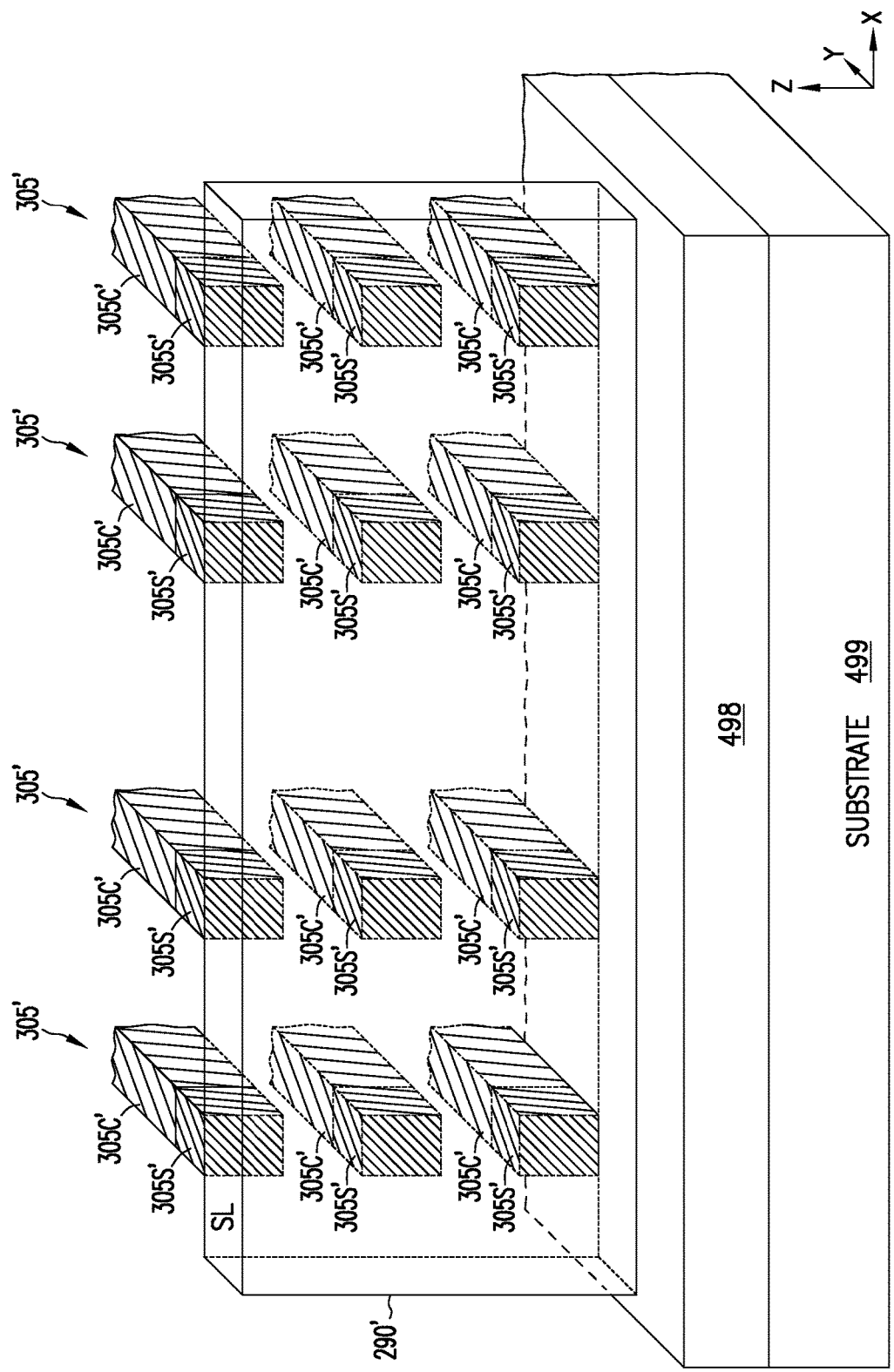

As shown in FIG. 14D additional processes can be performed to form source 290' that is electrically coupled to (e.g., contact) portions 305S' of respective channel structures 305. Source 290' is similar to (e.g., can correspond to) source 290 of memory device 200 of FIG. 3D. For simplicity, source 290' and portions 305S' of FIG. 14D are not shown in FIG. 14C.

As shown in FIG. 14A, FIG. 14B, FIG. 14C, and FIG. 14D, memory device 400 can include elements similar to or the same as those of memory device 200 described above with reference to FIG. 2A through FIG. 3E. Thus, memory device 1500 can include improvements and benefits similar to or the same as those of memory device 200 (FIG. 2A through FIG. 3E). The processes described above with reference to FIG. 4A through FIG. 14D can also be used to form memory device 200.

Figure 15:
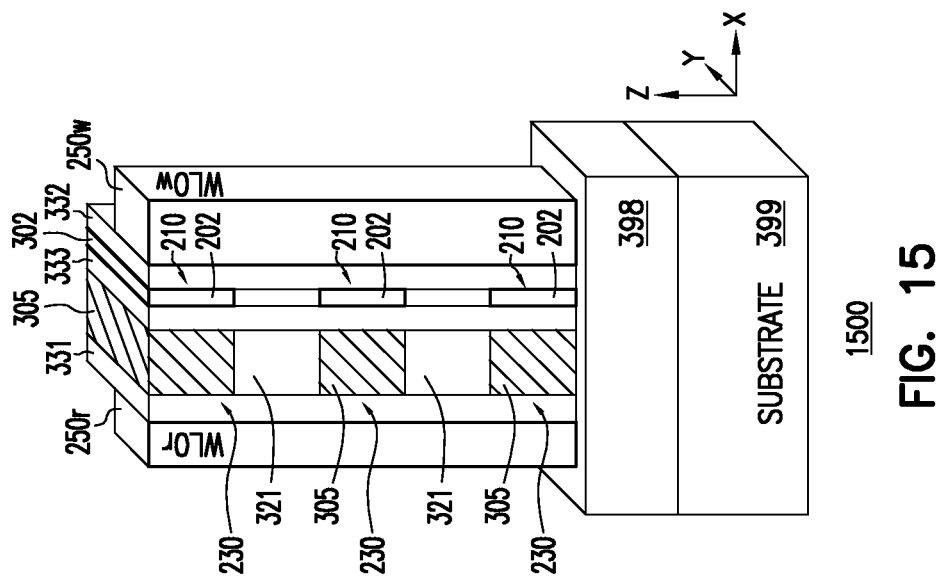
FIG. 15 shows a structure of a memory device that can be a variation of the memory device of FIG. 3A, according to some embodiments described herein.

FIG. 15 shows a structure of a memory device 1500, according to some embodiments described herein. Memory device 1500 can include elements that are similar to or the same as those of memory device 400 described above. For simplicity, detailed description of similar to the same elements is not repeated.

Differences between memory devices 400 and 1500 include the structure of charge storage structures 202 of memory device 1500 in FIG. 15. In memory device 200 of FIG. 3A (or memory device 400 in FIG. 14C), charge storage structures 202 of respective memory cells can be formed from a continuous structure of charge storage material (e.g., a single piece of charge storage material). In FIG. 15, charge storage structures 202 of respective memory cells of memory device 1500 may not be formed from part of a continuous structure of charge storage material. For example, as shown in FIG. 15, charge storage structures 202 of respective memory cells are separate structures (e.g., separate pieces) of charge storage materials and are not part of a continuous structure of charge storage material. Memory device 1500 can include improvements and benefits similar to or the same as those of memory device 200 (FIG. 2A through FIG. 3E).

Figure 16C:
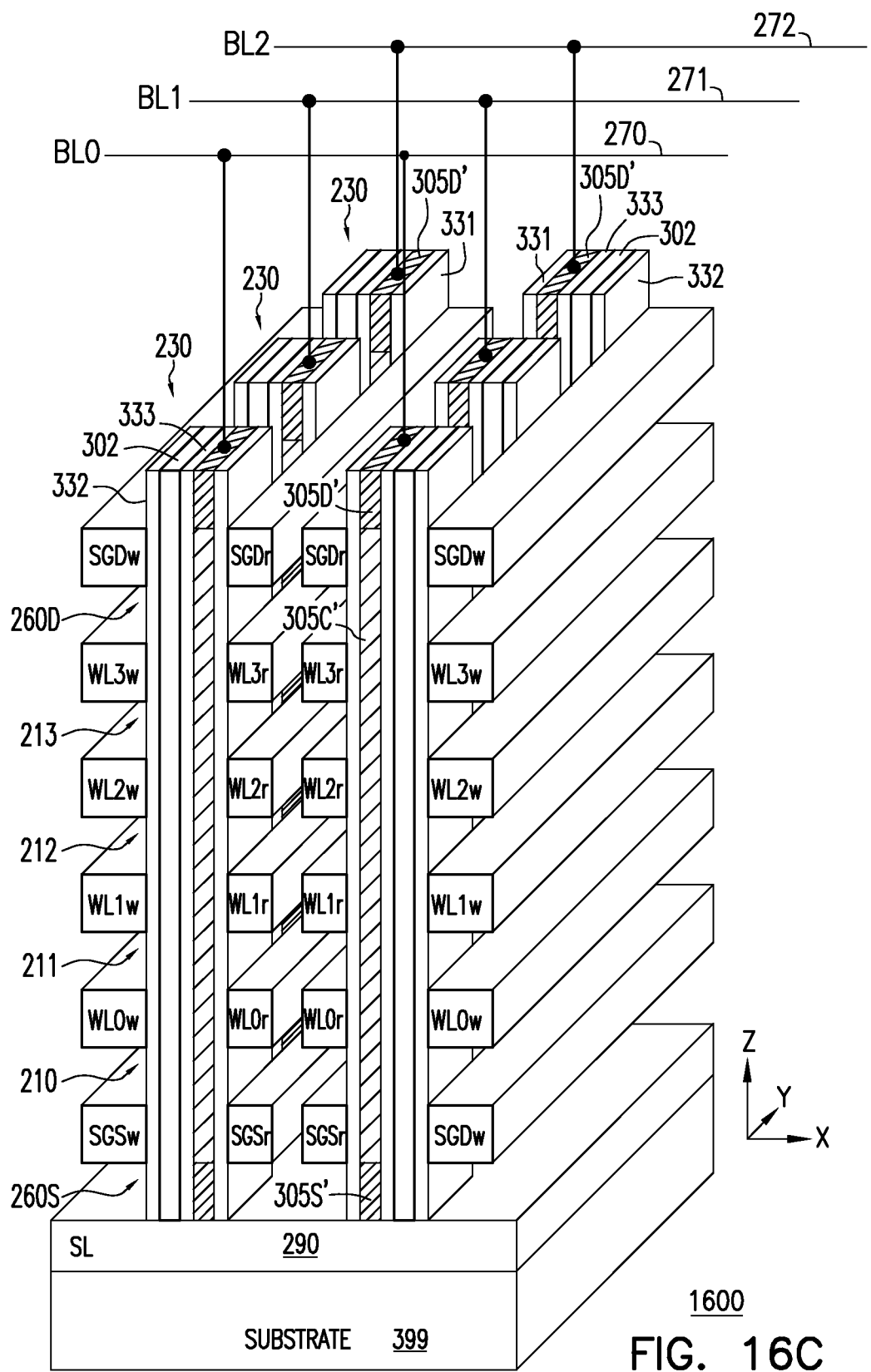

FIG. 16A, FIG. 16B, and FIG. 16C show a schematic diagram and structure of a memory device 1600, according to some embodiments described herein. Memory device 1600 can include elements that are similar to or the same as those of memory device 200 and 400 described above. For simplicity, detailed description of similar to the same elements is not repeated.

As shown in FIG. 16A and FIG. 16B, memory device 1600 can include memory cell strings 230 (having memory cells 210, 211, 212, and 213) and associated read control lines, read select lines, write control lines, write select lines, and select circuits 260 and 261 (having select transistors 260S and 261D, respectively).

As shown in FIG. 16C, memory device 1600 can include channel structures 305' (not labeled) having respective portions 305C, 305D, and 305S, channel structures 305' are electrically coupled to respective data lines 270, 271, and 272 and to source (e.g., a conductive region) 290, which can be formed over substrate 399. Memory device 1600 can also include dielectric structures (e.g., read gate oxides) 331, dielectric structures (e.g., write gate oxides) 332, and dielectric structures (e.g., blocking oxides) 333.

Differences between memory device 1600 of FIG. 16C and memory device 200 in FIG. 3A (or memory device 400 in FIG. 14C) include the orientation of the elements of memory device 1600 relative to the X-Y-Z directions in comparison with memory device 200 (or memory device 400). As shown in FIG. 16C, memory cells 210, 211, 212, and 213 of each memory cell string 230 can be formed one over another in the Z-direction (e.g., formed vertically over substrate 399). Also in memory device 1600, channel structure 305 associated with each memory cell string 230 can have a length extending in the Z-direction and is electrically coupled to source 290. Thus, each channel structure 305 of memory device 1600 can be perpendicular to the X-Y plane of substrate 399. In comparison with memory device 200 of FIG. 3A (or memory device 400 in FIG. 14C), memory cells 210, 211, 212, and 213 of a respective memory cell string 230 of memory device 200 are formed in the Y-direction, and channel structure 305 of a respective memory cell string has length extending in the Y-direction, in which the Y-direction is parallel to (e.g., parallel to the X-Y plane) the substrate 499.

As shown in FIG. 16C, read and write control gates of memory device 1600 have lengths in the Y-direction (e.g., parallel to the X-Y plane of substrate 399). In memory device 200 of FIG. 3A or memory device 400 in FIG. 14C, read and write control gates have lengths in the Z-direction, which is perpendicular to the X-Y plane of substrate 399 (or substrate 499). Memory device 1600 can include improvements and benefits similar to or the same as those of memory device 200 (FIG. 2A through FIG. 3E).

Figure 17:
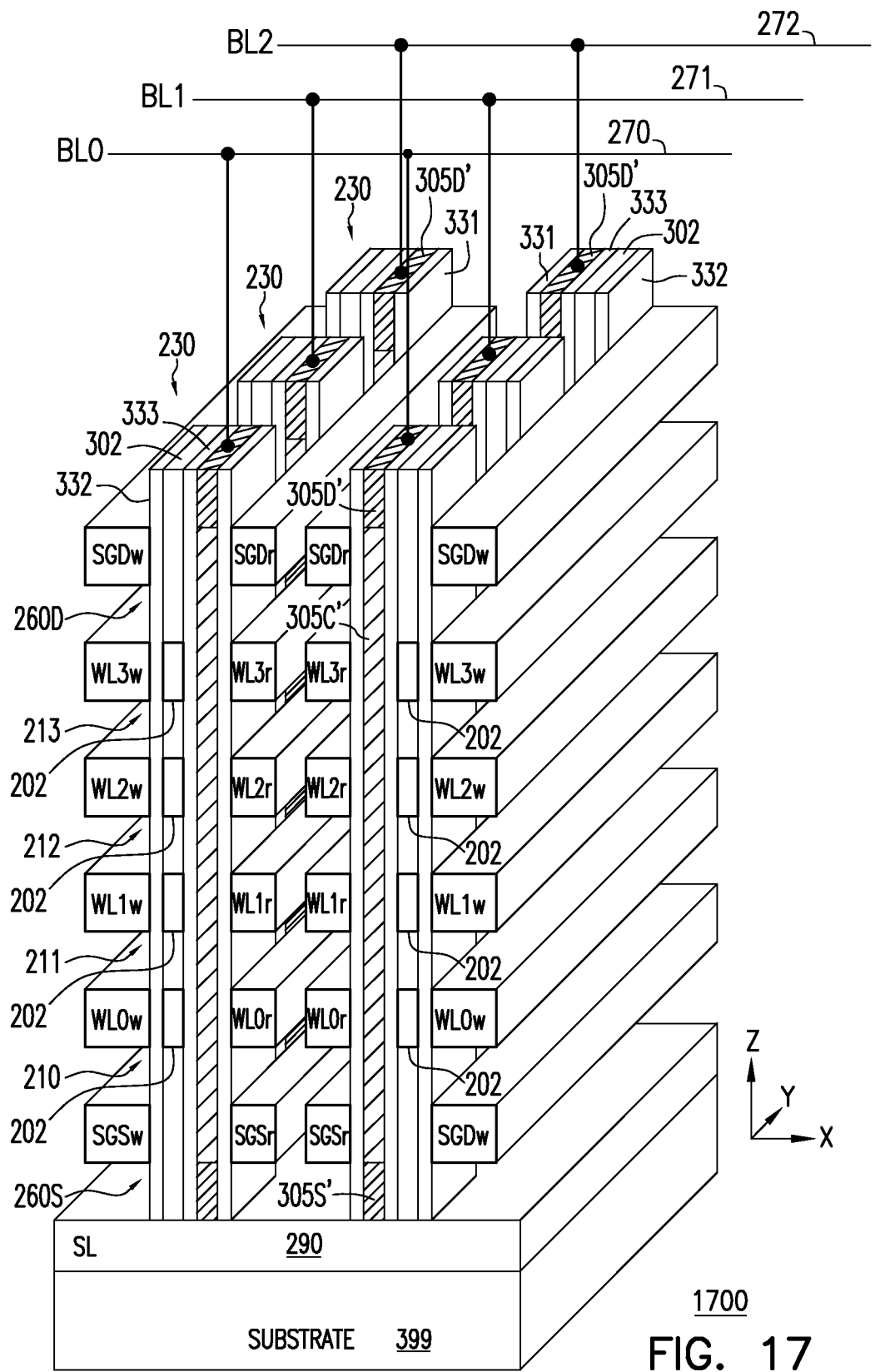
FIG. 17 shows a structure of a memory device that can be a variation of the memory device of FIG. 16C, according to some embodiments described herein.

FIG. 17 shows a structure of a memory device 1700, according to some embodiments described herein. Memory device 1700 can include elements that are similar to or the same as those of memory device 1600 described above. For simplicity, detailed description of similar to the same elements is not repeated.

Differences between memory devices 1600 and 1700 include the structure of charge storage structures 202 of memory device 1700 in FIG. 17. In memory device 1600 of FIG. 16C, charge storage structures 202 of respective memory cells are formed from a continuous structure (e.g., a single piece of) charge storage material. In FIG. 17, charge storage structures 202 of respective memory cells of memory device 1700 may not be part of a continuous structure of storage material. For example, as shown in FIG. 17, charge storage structures 202 of respective memory cells are separate structures (e.g., separate pieces) of charge storage materials and are not part of a continuous structure of charge storage material. Memory device 1700 can include improvements and benefits similar to or the same as those of memory device 200 (FIG. 2A through FIG. 3E).

The illustrations of apparatuses (e.g., memory devices 100, 200, 400, 1500, 1600, and 1700) and methods (e.g., method of forming memory device 400) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 400, 1500, 1600, and 1700) or a system (e.g., a computer, a cellular phone, or other electronic systems) that includes a device such as any of memory devices 100, 200, 400, 1500, 1600, and 1700.

Any of the components described above with reference to FIG. 1 through FIG. 17 can be implemented in a number of ways, including simulation via software. Thus, apparatuses, e.g., memory devices 100, 200, 400, 1500, 1600, and 1700, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 400, 1500, 1600, and 1700 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 17 include apparatuses and methods of forming the apparatuses. One of the apparatuses includes a memory cell included in a memory cell string; the memory cell including charge storage structure and channel structure separated from the charge storage structure by a dielectric structure; a first control gate associated with the memory cell and located on a first side of the charge storage structure and a first side of the channel structure; and a second control gate associated with the memory cell and electrically separated from the first control gate, the second control gate located on a second side of the charge storage structure and a second side of the channel structure. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, the terms "first", "second", and "third," etc. are used merely as labels, and are not intended to impose numerical requirements on their objects.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a memory cell included in a memory cell string, the memory cell including a charge storage structure and channel structure separated from the charge storage structure by a dielectric structure, wherein the memory cell is one of memory cells of the memory cell string, and the dielectric structure extends continuously between the memory cells of the memory cell string;
a first control gate associated with the memory cell and located on a first side of the charge storage structure and a first side of the channel structure; and
a second control gate associated with the memory cell and electrically separated from the first control gate, the second control gate located on a second side of the charge storage structure and a second side of the channel structure.

2. The apparatus of claim 1, further comprising a substrate, wherein:
the memory cell string is located over the substrate; and
each of the first and second control gates has a length in a direction between the substrate and the memory cell string.

3. The apparatus of claim 1, further comprising a substrate, wherein:
the memory cell string is located over the substrate; and
each of the first and second control gates has a length in a direction perpendicular to a direction between the substrate and the memory cell string.

4. The apparatus of claim 1, further comprising a substrate and an additional dielectric located over the substrate, wherein:
the memory cell string is located over the substrate; and
the additional dielectric structure is between the channel structure and the substrate.

5. The apparatus of claim 1, further comprising a substrate and a conductive region formed over the substrate, wherein:
the memory cell string is located over the substrate; and
the channel structure is electrically coupled to the conductive region.

6. The apparatus of claim 1, wherein the charge storage structure includes a dielectric material.

7. The apparatus of claim 1, wherein the charge storage structure includes a polysilicon material.

8. The apparatus of claim 1, further comprising an additional dielectric structure between the first control gate and the channel structure, wherein:
the channel structure has a first thickness; and
the additional dielectric structure has a second thickness less than the first thickness.

9. An apparatus comprising:
a memory cell string including memory cells;
first control gates for selectively accessing one of the memory cells during a read operation;
second control gates for selectively accessing at least one of the memory cells during an additional operation different from the read operation, wherein the second control gates are electrically separated from the first control gates;
a charge storage structure and a channel structure included in the memory cell string; and
a dielectric structure between the charge storage structure and the channel structure, wherein the dielectric structure extends continuously between the memory cells of the memory cell string.

10. The apparatus of claim 9, wherein the additional operation includes a write operation.

11. The apparatus of claim 9, wherein the additional operation includes an erase operation.

12. The apparatus of claim 9, further comprising a channel structure associated with the memory cell string, wherein:
the first control gates are located on a first side of the channel structure; and
the second control gates are located on a second side of the channel structure.

13. The apparatus of claim 9, further comprising a dielectric structure between respective charge storage structures of the memory cells and the second control gates, wherein the dielectric structure is configured to facilitate tunneling of charge between the charge storage structures and the second control gates.

14. The apparatus of claim 9, wherein the first and second control gates include conductively doped polysilicon material.

15. The apparatus of claim 9, further comprising a substrate, wherein:
the memory cell string is located over the substrate; and
the first and second control gates have respective lengths in a direction between the memory cell string and the substrate.

16. The apparatus of claim 9, further comprising a substrate, wherein:
the memory cell string is located over the substrate; and
the first and second control gates have respective lengths in a direction perpendicular to a direction between the memory cell string and the substrate.

* * * * *